(12) United States Patent
Zhang et al.

(10) Patent No.: US 9,917,590 B2
(45) Date of Patent: Mar. 13, 2018

(54) DELAY LOCKED LOOP

(71) Applicant: Marvell World Trade Ltd., St. Michael (BB)

(72) Inventors: Tao Zhang, Campbell, CA (US); Xuemei Liu, Milpitas, CA (US); Hui Wang, Pleasanton, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/172,115

(22) Filed: Jun. 2, 2016

(65) Prior Publication Data

US 2016/0359492 A1    Dec. 8, 2016

Related U.S. Application Data

(60) Provisional application No. 62/170,510, filed on Jun. 3, 2015.

(51) Int. Cl.
| | |
|---|---|
| *H04L 7/00* | (2006.01) |
| *H04L 25/00* | (2006.01) |
| *H04L 25/40* | (2006.01) |
| *H03L 7/08* | (2006.01) |
| *H03L 7/081* | (2006.01) |
| *H03L 7/091* | (2006.01) |
| *H03K 5/06* | (2006.01) |

(52) U.S. Cl.
CPC ............ *H03L 7/0807* (2013.01); *H03K 5/06* (2013.01); *H03L 7/0814* (2013.01); *H03L 7/091* (2013.01); *H04L 7/0037* (2013.01)

(58) Field of Classification Search
CPC ...... H04L 7/033; H04L 7/0337; H04L 7/0331; H04L 7/0338; H03L 7/0814
USPC .................................... 375/354–376
See application file for complete search history.

(56) References Cited

U.S. PATENT DOCUMENTS

| | | |
|---|---|---|
| 5,910,740 A | 6/1999 | Underwood |
| 6,046,620 A | 4/2000 | Relph |
| 6,054,884 A * | 4/2000 | Lye .................. H03K 5/131 327/269 |
| 6,100,735 A * | 8/2000 | Lu ...................... H03L 7/07 327/158 |

(Continued)

OTHER PUBLICATIONS

International Preliminary Report on Patentability for International Application No. PCT/US2016/035598 dated Dec. 5, 2017.

*Primary Examiner* — James M Perez

(57) ABSTRACT

A programmable delay line comprises a delay stage responsive to an analog control signal and responsive to one or more digital control signals. The delay stage generates an output signal that is delayed relative to an input signal by a delay amount. The delay amount controlled by a value of the analog control signal and one or more values of the digital control signals. A method for controlling a delay locked loop circuit comprises providing, to a programmable delay line of the delay locked loop circuit, a one or more digital signals, and providing, to the programmable delay line, an analog signal. A first portion of a delay produced by the programmable delay line corresponds to values of the one or more digital signals. A second portion of the delay produced by the programmable delay line corresponds to a value of the analog signal.

18 Claims, 9 Drawing Sheets

(56) References Cited

U.S. PATENT DOCUMENTS

| | | | |
|---|---|---|---|
| 6,104,223 A * | 8/2000 | Chapman | H03H 17/08 327/276 |
| 6,154,497 A | 11/2000 | Gatherer et al. | |
| 6,353,649 B1 * | 3/2002 | Bockleman | G06F 1/025 327/107 |
| 6,510,191 B2 * | 1/2003 | Bockleman | G06F 1/022 327/269 |
| 6,628,154 B2 * | 9/2003 | Fiscus | H03L 7/0814 327/158 |
| 6,628,276 B1 * | 9/2003 | Elliott | G09G 5/008 345/213 |
| 6,680,634 B1 * | 1/2004 | Ruha | H03L 7/0812 327/149 |
| 6,794,913 B1 * | 9/2004 | Stengel | H03L 7/0814 327/158 |
| 6,975,260 B1 * | 12/2005 | Abdollahi-Alibeik | H03M 1/68 341/120 |
| 7,038,511 B2 * | 5/2006 | Kim | H03L 7/0805 327/158 |
| 7,058,150 B2 * | 6/2006 | Buchwald | H03L 7/0814 370/307 |
| 7,271,634 B1 * | 9/2007 | Daga | H03L 7/0812 327/149 |
| 7,339,407 B2 * | 3/2008 | Jakobs | H03L 7/0812 327/158 |
| 7,439,787 B2 * | 10/2008 | Hashim | H03L 7/07 327/172 |
| 7,504,976 B1 * | 3/2009 | Pellon | H04L 27/36 341/143 |
| 7,570,093 B1 * | 8/2009 | Huang | H03L 7/0812 327/149 |
| RE41,831 E * | 10/2010 | Sutardja | H03K 5/01 341/144 |
| 7,839,191 B2 * | 11/2010 | Takai | H03K 5/13 327/149 |
| 7,888,973 B1 * | 2/2011 | Rezzi | H03L 7/085 327/105 |
| 7,936,196 B2 * | 5/2011 | Kim | G11C 7/22 327/149 |
| 8,139,628 B1 * | 3/2012 | Altekar | H04L 25/06 375/229 |
| 8,253,455 B2 * | 8/2012 | Hyun | H03L 7/0814 327/147 |
| 8,253,457 B2 * | 8/2012 | Aremallapur | H03L 7/0812 327/156 |
| 8,593,195 B1 * | 11/2013 | Huang | G11C 7/22 327/231 |
| 9,602,111 B1 * | 3/2017 | Shen | H03L 7/0814 |
| 9,660,620 B1 * | 5/2017 | Zyuban | H03K 5/01 |
| 9,698,798 B1 * | 7/2017 | Fredenburg | H03L 7/0814 |
| 9,705,516 B1 * | 7/2017 | Fredenburg | H03L 7/0995 |
| 2002/0061087 A1 * | 5/2002 | Williams | G11B 20/10055 375/376 |
| 2003/0025539 A1 * | 2/2003 | Fiscus | H03L 7/0814 327/158 |
| 2003/0099321 A1 * | 5/2003 | Juan | H03L 7/07 375/376 |
| 2004/0008729 A1 * | 1/2004 | Rogerson | H03K 3/0315 370/478 |
| 2004/0125905 A1 * | 7/2004 | Vlasenko | H03L 7/0814 375/376 |
| 2005/0057291 A1 * | 3/2005 | Nguyen | H03K 5/1565 327/175 |
| 2005/0278131 A1 * | 12/2005 | Rifani | G01R 29/0273 702/79 |
| 2006/0017512 A1 * | 1/2006 | Huang | H03L 7/0812 331/17 |
| 2006/0066368 A1 * | 3/2006 | Gabato, Jr. | H03K 5/1504 327/158 |
| 2007/0075757 A1 * | 4/2007 | Kumar | H03L 7/0812 327/158 |
| 2007/0216454 A1 * | 9/2007 | Fan | G11C 7/1072 327/149 |
| 2007/0222493 A1 * | 9/2007 | Afentakis | H03K 5/133 327/276 |
| 2008/0012549 A1 * | 1/2008 | Kam | G01R 29/26 324/76.54 |
| 2008/0298476 A1 * | 12/2008 | Bereza | H03K 5/15026 375/257 |
| 2009/0009228 A1 * | 1/2009 | Jang | G06F 1/08 327/295 |
| 2010/0060334 A1 * | 3/2010 | Abe | H03L 7/0814 327/158 |
| 2010/0123494 A1 * | 5/2010 | Heightley | G11C 7/1051 327/158 |
| 2010/0264963 A1 * | 10/2010 | Kikuchi | H03K 5/131 327/157 |
| 2010/0308880 A1 * | 12/2010 | Wang | H03L 7/0807 327/163 |
| 2010/0329091 A1 * | 12/2010 | Gubbins | B82Y 10/00 369/47.28 |
| 2011/0169563 A1 | 7/2011 | Bhaumik et al. | |
| 2012/0086485 A1 | 4/2012 | Trivedi et al. | |
| 2013/0016982 A1 * | 1/2013 | Henzler | H03H 11/265 398/161 |
| 2013/0194112 A1 * | 8/2013 | Harwood | H03M 7/00 341/50 |
| 2013/0321190 A1 * | 12/2013 | Lesso | H03M 1/34 341/158 |
| 2013/0342256 A1 * | 12/2013 | Wadhwa | H03K 3/356104 327/277 |
| 2014/0091954 A1 * | 4/2014 | Zhu | H02M 3/06 341/110 |
| 2015/0213779 A1 * | 7/2015 | Baek | G09G 5/008 345/204 |
| 2016/0006421 A1 * | 1/2016 | Saric | H03L 7/099 375/327 |
| 2016/0056806 A1 * | 2/2016 | Rapinoja | H03K 5/159 327/158 |
| 2016/0241250 A1 * | 8/2016 | Cops | H03L 7/0814 |
| 2017/0272085 A1 * | 9/2017 | Vlasenko | H03L 7/0814 |

* cited by examiner

Table 1: Stage Control Values

| Value (V) | SCTL[1, 7..1]p | SCTL[1, 7..1]n | SCTL[2, 7..1]p | SCTL[2, 7..1]n | SCTL[3, 7..1]p | SCTL[3, 7..1]n |
|---|---|---|---|---|---|---|
| 0 | 0000000 | 1111111 | 0000000 | 1111111 | 0000000 | 1111111 |
| $0 < V \leq 6$ | see FIG. 7 | see FIG. 7 | 0000000 | 1111111 | 0000000 | 1111111 |
| $6 < V \leq 12$ | 1111110 | 0000001 | see FIG. 7 | see FIG. 7 | 0000000 | 1111111 |
| $12 < V < 19$ | 1111110 | 0000001 | 1111110 | 0000001 | see FIG. 7 | see FIG. 7 |

FIG. 7
Table 2: Thermometer Coding, L = Lowest Value when Active Stage

| Value (V) | Code | SCTL[I,7..1]p | SCTL[I, 7..1]n |
|---|---|---|---|
| L | 0000000 | 0000000 | 1111111 |
| L < V < L+1 | 000000X | 000000X | 111111Y |
| 1 | 0000001 | 0000001 | 1111110 |
| L+1 < V < L+2 | 000001X | 000001X | 111110Y |
| L+2 | 0000011 | 0000011 | 1111100 |
| L+2 < V < L+3 | 000011X | 000011X | 111100Y |
| L+3 | 0000111 | 0000111 | 1111000 |
| L+3 < V < L+4 | 000111X | 000111X | 111000Y |
| L+4 | 0001111 | 0001111 | 1110000 |
| L+4 < V < 5 | 001111X | 001111X | 110000Y |
| L+5 | 0011111 | 0011111 | 1100000 |
| L+5 < V < L+6 | 011111X | 011111X | 100000Y |
| L+6 | 0111111 | 0111111 | 1000000 |
| L+6 < V < L+7 | 111111X | 111111X | 000000Y | for SCTL, 1=VDD, 0=VSS , X=Output of DAC, 0 < X < VDD; Y=VDD-X

FIG. 8
Table 3: Stage Control Values

| Value (V) | SCTL[1, 7..1]p | SCTL[1, 7..1]n | SCTL[2, 7..1]p | SCTL[2, 7..1]n | SCTL[3, 7..1]p | SCTL[3, 7..1]n |
|---|---|---|---|---|---|---|
| 0 | 0000000 | 1111111 | 0000000 | 1111111 | 0000000 | 1111111 |
| 0 < V < 1 | 000000X | 111111Y | 0000000 | 1111111 | 0000000 | 1111111 |
| 1 | 0000001 | 1111110 | 0000000 | 1111111 | 0000000 | 1111111 |
| 1 < V < 2 | 0000001 | 1111110 | 000000X | 111111Y | 0000000 | 1111111 |
| 2 | 0000001 | 1111110 | 0000001 | 1111110 | 0000000 | 1111111 |
| 2 < V < 3 | 0000001 | 1111110 | 0000001 | 1111110 | 000000X | 111111Y |
| 3 | 0000001 | 1111110 | 0000001 | 1111110 | 0000001 | 1111110 |
| 3 < V <4 | 000001X | 111110Y | 0000001 | 1111110 | 0000001 | 1111110 |
| 4 | 0000011 | 1111100 | 0000001 | 1111110 | 0000001 | 1111110 |
| 4 < V < 5 | 0000011 | 1111100 | 000001X | 111110Y | 0000001 | 1111110 |
| 5 | 0000011 | 1111100 | 0000011 | 1111100 | 0000001 | 1111110 |
| 5 < V < 6 | 0000011 | 1111100 | 0000011 | 1111100 | 000001X | 111110Y |
| 6 | 0000011 | 1111100 | 0000011 | 1111100 | 0000011 | 1111100 |
| 6 < V <7 | 000011X | 111100Y | 0000011 | 1111100 | 0000011 | 1111100 |
| 7 | 0000111 | 1111000 | 0000011 | 1111100 | 0000011 | 1111100 |
| 7 < V < 8 | 0000111 | 1111000 | 000011X | 111100Y | 0000011 | 1111100 |
| 8 | 0000111 | 1111000 | 0000111 | 1111000 | 0000011 | 1111100 |
| 8 < V < 9 | 0000111 | 1111000 | 0000111 | 1111000 | 000011X | 111100Y |

⋮ for SCTL, 1 = VDD, 0 = VSS , X = Output of DAC, 0 < X < 1; Y = 1-X

Table 4: Thermometer Coding, L = Lowest Value when Active Stage

| Value (V) | Code | SCTL[I,7..1]p | SCTL[I, 7..1]n |
|---|---|---|---|
| 0 | 0000000 | 0000000 | 1111111 |
| 0 < V < 1 | 000000X | 000000X | 111111Y |
| 1 | 0000001 | 0000001 | 1111110 |
| 1 < V < 2 | 00000X1 | 00000X1 | 11111Y0 |
| 2 | 0000011 | 0000011 | 1111100 |
| 2 < V < 3 | 0000X11 | 0000X11 | 111100Y |
| 3 | 0000111 | 0000111 | 1111000 |
| 3 < V < 4 | 000X111 | 000X111 | 111Y000 |
| 4 | 0001111 | 0001111 | 1110000 |
| 4 < V < 5 | 00X1111 | 00X1111 | 11Y0000 |
| 5 | 0011111 | 0011111 | 1100000 |
| 5 < V < 6 | 0X11111 | 0X11111 | 1Y00000 |
| 6 | 0111111 | 0111111 | 1000000 |
| 6 < V < 7 | X111111 | X111111 | Y000000 | for SCTL, 1=VDD, 0=VSS , X=Output of DAC, 0 < X < VDD; Y=VDD-X

FIG. 13

Table 5: Hybrid Thermometer Coding

| Value (V) | Code | SCTL[I,6..1]p | SCTL[I,6..1]n |
|---|---|---|---|
| 0 | 00 0000 | 00 0000 | 11 1111 |
| 0 < V < 1 | 00 000X | 00 000X | 11 111Y |
| 1 | 00 0001 | 00 0001 | 11 1110 |
| 1 < V < 2 | 00 001X | 00 001X | 11 110Y |
| 2 | 00 0011 | 00 0011 | 11 1100 |
| 2 < V < 3 | 00 011X | 00 011X | 11 100Y |
| 3 | 00 0111 | 00 0111 | 11 1000 |
| 3 < V < 4 | 00 111X | 00 111X | 11 000Y |
| 4 | 01 0000 | 01 0000 | 10 1111 |
| 4 < V < 5 | 01 000X | 01 000X | 10 111Y |
| 5 | 01 0001 | 01 0001 | 10 1110 |
| 5 < V < 6 | 01 001X | 01 001X | 10 110Y |
| 6 | 01 0011 | 01 0011 | 10 1100 |
| 6 < V < 7 | 01 011X | 01 011X | 10 100Y |
| 7 | 01 0111 | 01 0111 | 10 1000 |
| 7 < V < 8 | 01 111X | 01 111X | 10 000Y |
| 8 | 10 0000 | 10 0000 | 01 1111 |
| 8 < V < 9 | 10 000X | 10 000X | 01 111Y |
| 9 | 10 0001 | 10 0001 | 01 1110 |
| 9 < V < 10 | 10 001X | 10 001X | 01 110Y |
| 10 | 10 0011 | 10 0011 | 01 1100 |
| 10 < V < 11 | 10 011X | 10 011X | 01 100Y |
| 11 | 10 0111 | 10 0111 | 01 1000 |
| 11 < V < 12 | 10 111X | 10 111X | 01 000Y |
| 12 | 11 0000 | 11 0000 | 00 1111 |
| 12 < V < 13 | 11 000X | 11 000X | 00 111Y |
| 13 | 11 0001 | 11 0001 | 00 1110 |
| 13 < V < 14 | 11 001X | 11 001X | 00 110Y |
| 14 | 11 0011 | 11 0011 | 00 1100 |
| 14 < V < 15 | 11 011X | 11 011X | 00 100Y |
| 15 | 11 0111 | 11 0111 | 00 1000 |
| 15 < V < 16 | 11 111X | 11 111X | 00 000Y | for SCTL, 1=VDD, 0=VSS, X=Output of DAC, 0 < X < VDD; Y=VDD-X

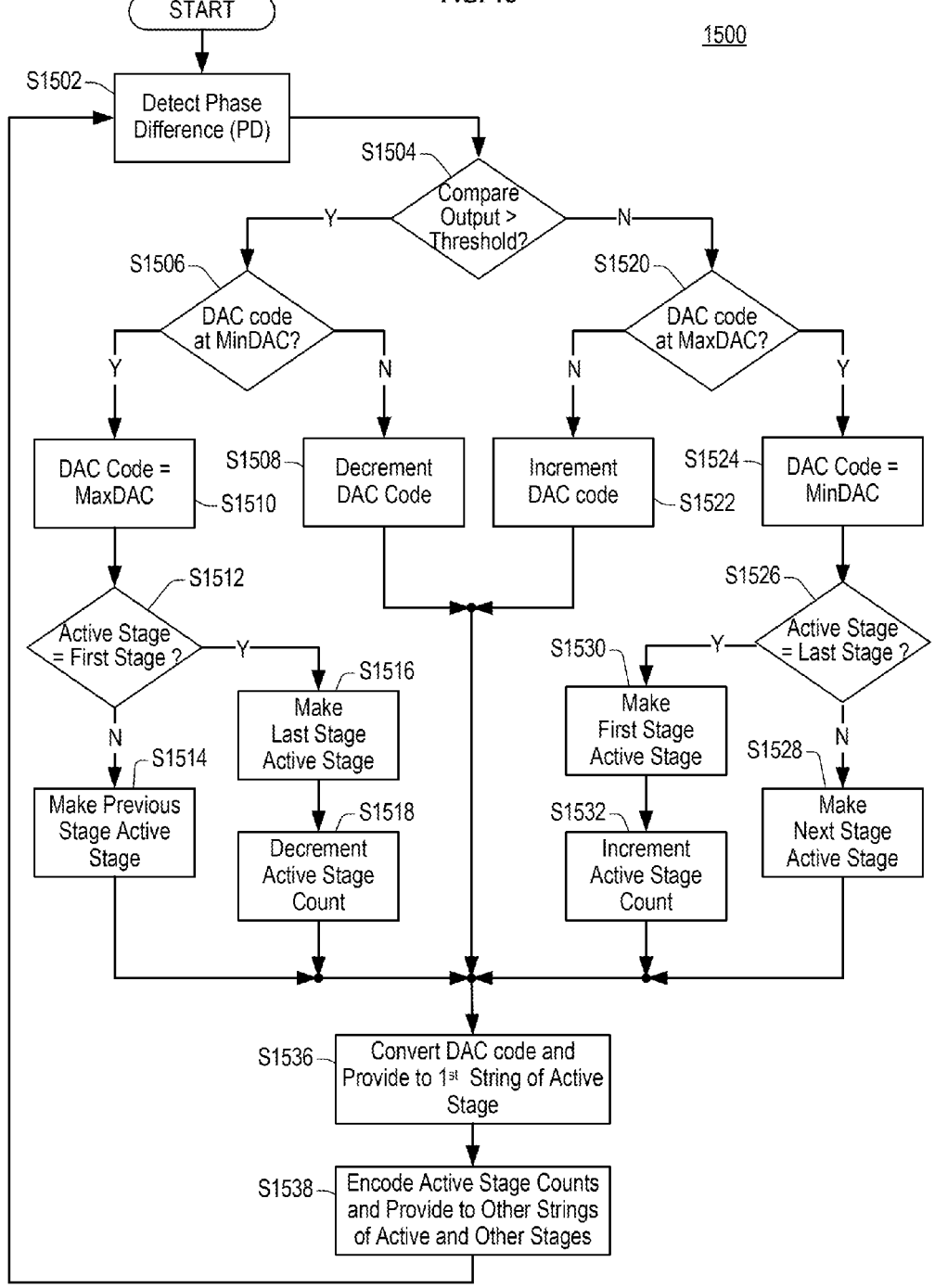

DELAY LOCKED LOOP

CROSS REFERENCE TO RELATED APPLICATION

This present disclosure claims the benefit of U.S. Provisional Application No. 62/170,510, filed on Jun. 3, 2015, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In a high speed serial communication link, such as the lanes of a 10 Gigabit (10 G) or 100 Gigabit (100 G) Ethernet connection, a transmitter transmits a data signal into a communication channel (channel) without an accompanying clock signal. The data signal includes a sequence of symbols, each symbol carrying information from some number of bits, such as one, two, or more bits, or in some cases tractions of bits. The data is transmitted at a rate determined by a transmission (Tx) clock signal.

In order to receive the data on the communication link, a receiver determines a phase and a frequency of a clock used to sample a signal received from the channel. The process of determining the phase and frequency of the clock is part of a Clock and Data Recovery (CDR) process. The CDR process typically uses a circuit including a Delay Locked Loop (DLL).

A DLL generates an output signal having a specified phase relationship with an input signal. For example, the DLL may be used to produce the output signal having a transition occurring at a delay from a transition of the input signal equal to a quarter, a half, or three-quarters of a clock period of the input signal. The input signal typically includes a clock signal.

The DLL includes one or more variable delay line circuits that are used to generate the output signal by delaying the input signal. The delay produced by the one or more delay line circuits is controlled according to a phase detect signal produced by a phase detect circuit.

SUMMARY

Embodiments relate to delay locked loop circuits.

In an embodiment, a programmable delay line comprises a delay stage responsive to an analog control signal and responsive to one or more digital control signals. The delay stage generates an output signal that is delayed relative to an input signal by a delay amount. The delay amount is according to a value of the analog control signal and one or more values of the one or more digital control signals.

In an embodiment, a method for controlling a delay locked loop circuit comprises providing, to a programmable delay line of the delay locked loop circuit, a one or more digital signals, and providing, to the programmable delay line, an analog signal. A first portion of a delay produced by the programmable delay line corresponds to values of the one or more digital signals. A second portion of the delay produced by the programmable delay line corresponds to a value of the analog signal.

BRIEF DESCRIPTION OF THE DRAWINGS

FIG. 7 includes a Table 2 showing stage control values for a delay stages such as the delay stage of FIG. 4, according to an embodiment.

FIG. 8 includes a Table 3 showing stage control values for a DLL including three delay stages such as the delay stage of FIG. 4, according to another embodiment.

FIG. 13 includes a Table showing stage control values for a delay stages such as the delay stage of FIG. 11, according to an embodiment.

FIG. 15 shows a process for operating a delay locked loop, according to another embodiment.

DETAILED DESCRIPTION

In this document, a digital value means a value expressed in one or more bits, each bit having a value of 0 or 1. A binary signal means a signal including n bits $b_0 \ldots b_{n-1}$ and having a value corresponding to $\Sigma_{i=0}^{n-1} b_i 2^i$, where n is greater than or equal to 1. A thermometer coded signal means a signal having n bits $b_0 \ldots b_{n-1}$ and having a value corresponding to $\Sigma_{i=0}^{n-1} b_i$, where n is greater than or equal to 1. A 1-bit digital signal has a first value corresponding to a value of 0 and a second value corresponding to a value of 1, and corresponds to the value of a bit. An analog signal has a plurality of values, typically 8 or more, distributed between a minimum value and a maximum value, and expressed using a different voltage level or current level for each value.

Figure 1:
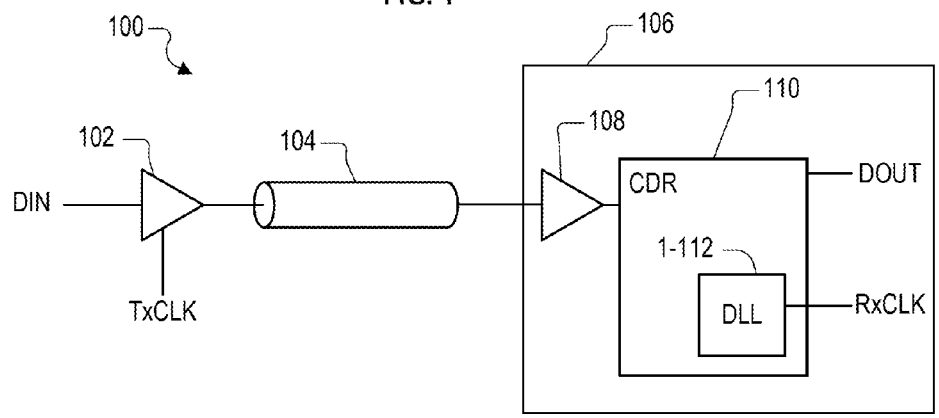
FIG. 1 illustrates a communication link, according to an embodiment.

FIG. 1 illustrates a communication link 100 according to an embodiment. The communications link includes a transmitter 102, a channel 104, and a receiver 106. The receiver includes an Analog Front End (AFE) 108 and a (Clock and Data Recovery (CDR) circuit 110. In an embodiment, the CDR circuit 110 is included in an integrated circuit.

The transmitter 102 receives input data DIN and a transmit clock TxCLK. The transmitter 102 generates symbols based on the input data DIN and transmits the symbols into the channel 104 at a rate determined by the transmit clock TxCLK, each symbol being transmitted in a Unit Interval (UI) equal to the inverse of a frequency of the transmit clock TxCLK.

The channel 104 propagates the symbols from the transmitter 102 to the receiver 106. As the symbols are propagated, properties of the channel 104 cause modification of the symbols, in particular, dispersions and reflections in the channel 104 may change the propagation time of portions of energy used to transmit the symbol.

The AFE 108 receives the energy from the channel 104 and produces an output signal. The AFE 108 may include, for example, circuits configured to isolate, impedance match, equalize, and amplify the energy received from the channel 104.

The CDR circuit 110 receives the AFE output signal from the AFE 108, determines a frequency and phase of a receive clock RxCLK from the output signal from the AFE 108, and recovers received data DOUT from the output signal from the AFE 108 using the receive clock RxCLK. The CDR circuit 110 then outputs the received data DOUT. In an embodiment, the CDR circuit 110 additionally outputs the receive clock RxCLK for use by other circuits.

The CDR circuit 110 includes a Delay Locked Loop (DLL) circuit 1-112, in an embodiment. The DLL circuit 1-112 produces the receive clock RxCLK according to the AFE output signal. In particular, the DLL circuit 1-112 produces the receive clock RxCLK by maintaining a predetermined relationship between a phase of the receive clock RxCLK and a phase of the AFE output signal.

In an embodiment, the CDR circuit 110 has a bandwidth of tens of MHz. In the circuit shown, a jitter requirement of the receive clock RxCLK is relaxed because a phase loop of the CDR circuit 110 is a digital integrator and therefore averages out high frequency noise in the output of DLL circuit 1-112. Noise having a frequency lower than a bandwidth of the DLL circuit 1-112 is suppressed by a loop including the DLL circuit 1-112.

In an embodiment, the CDR circuit 110 tolerates phase disturbances of up to one picosecond in the receive clock RxCLK. As a result, a digital DLL is suitable for use in the DLL circuit 1-112.

Figure 2:
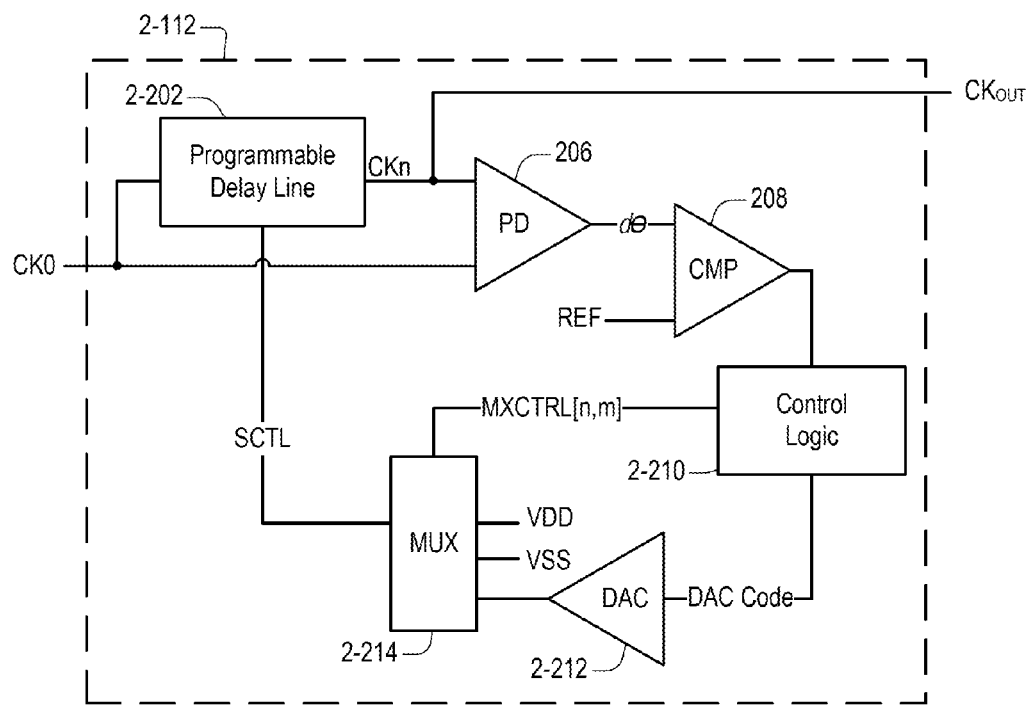
FIG. 2 illustrates a Delay Locked Loop (DLL) circuit, according to an embodiment.

FIG. 2 illustrates a Delay Locked Loop (DLL) circuit 2-112 according to an embodiment. In an embodiment, the DLL circuit 2-112 is included in the DLL circuit 1-112 of FIG. 1, but embodiments are not limited thereto.

The DLL circuit 2-112 includes a programmable delay line circuit (or programmable delay line) 2-202, a Phase Detector (PD) 206, a comparator 108, control logic 2-210, a Digital to Analog Converter (DAC) 2-212, and a multiplexer (mux) circuit 2-214.

The programmable delay line 2-202 receives an input clock signal CK0 and a plurality of stage control signals SCTL. The programmable delay line 2-202 produces a delayed clock signal $CK_{OUT}$ (here, an $n^{th}$ delayed clock CKn) by delaying the input clock signal CK0 by an amount corresponding to a value of the plurality of stage control signals SCTL.

The PD 206 determines a phase difference corresponding to a phase difference between the input clock signal CK0 and the delayed clock signal $CK_{OUT}$ and outputs a phase difference signal dθ. In an embodiment, the phase difference signal dθ has a voltage value proportional to the determined phase difference.

The comparator 208 compares the phase difference signal dθ to a predetermined reference value REF to determine a comparator output signal. In an embodiment, the comparator output signal has a first value (such as a high value) when the value of the phase difference signal dθ is less than the predetermined reference value REF, and has a second value (such as a low value) otherwise.

The control logic 2-210 receives the comparator output signal and determines, according to values of the comparator output signal and values of an internal state of the control logic 2-210, a plurality of mux control signals MXCTRL and a DAC code signal. In embodiments, the mux control signals MXCTRL includes thermometer coded signals, binary coded signals, or both.

In an embodiment, the control logic 2-210 includes one or more counters configured to be incremented and decremented, i.e. up/down counters. A count of the counters is representative of an internal state of the control logic 2-210.

The DAC 2-212 receives the DAC code signal and produces a DAC output signal. The DAC output signal has a voltage value corresponding to a value of the DAC code signal. In an embodiment, the DAC output signal is a differential signal including a plus signal having a value corresponding to the value of the DAC code signal and a minus signal having a value corresponding to a first power supply voltage VDD minus the value corresponding to the value of the DAC code signal.

The mux circuit 2-214 receives me mux control signals MXCTRL, the DAC output signal, a first supply voltage VDD, and a second supply voltage VSS. The mux circuit 2-214 produces the plurality of stage control signals SCTL.

For each of the plurality of stage control signals SCTL [x,y], the mux circuit 2-214 selects, according to the mux control signals MXCTRL, a value corresponding to one of the DAC output signal, the first supply voltage VDD, and the second supply voltage VSS.

When the DAC output signal is a differential signal and the mux circuit 2-214 selects the DAC output signal for the stage control signal SCTL[x,y], the mux circuit 2-214 provides the plus and minus signals of the DAC output signal to plus and minus signals of the stage control signal SCTL[x,y]. In an embodiment, the plus and minus signals of the stage control signal SCTL[x,y] correspond to p-channel and n-channel control signals, respectively.

The control logic 2-210 controls the mux control signals MXCTRL and the DAC code signal to control the delay produced by the programmable delay line 2-202 for the delayed clock signal $CK_{OUT}$ relative to the input clock signal CK0. The control logic 2-210 controls the delay to maintain a predetermined phase difference between the delayed clock signal $CK_{OUT}$ and the input clock signal CK0.

Figure 3:
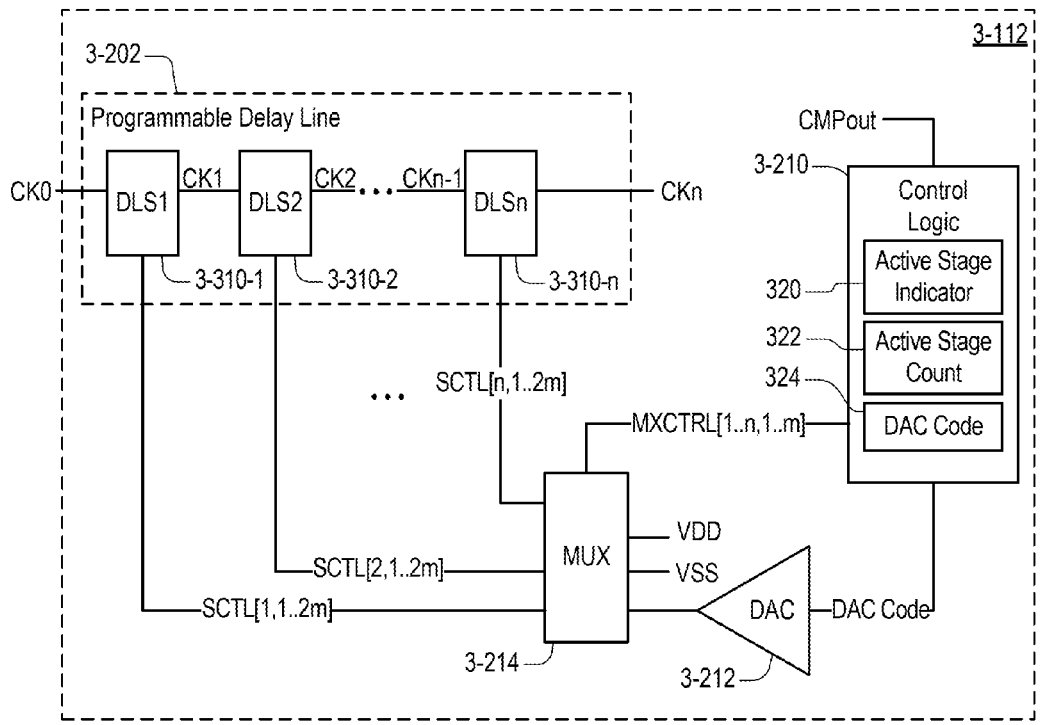
FIG. 3 illustrates additional details of a DLL circuit such as the DLL circuit of FIG. 2, according to an embodiment.

FIG. 3 illustrates additional details of a DLL circuit 3-112 according to an embodiment. The DLL circuit 3-112 is suitable for use in the DLL circuit 2-122 of FIG. 2. The DLL circuit 3-112 includes a programmable delay line 3-202, control logic 3-210, a DAC 3-212, and a mux circuit 3-214.

In an embodiment, the control logic 3-210, the DAC 3-212, and the mux circuit 3-214 respectively correspond to the control logic 2-210, the DAC 2-212, and the mux circuit 2-214 of FIG. 2.

In an embodiment, an internal state of the control logic 3-210 includes one or more of an Active Stage Indicator 320, an Active Stage Count 322, a DAC code 324, and the like. In an embodiment, the Active Stage Indicator 322 has a value X indicate an $X^{th}$ delay stage 3-310-X of the programmable delay line 3-202 for which a total drive current will be increased or decreased according to a value of a comparator output signal CMPout. In an embodiment, the Active Stage Count 322 corresponds to a digital value provided to the $X^{th}$ delay stage 3-310-X indicated by the Active Stage Indicator 320. The digital value controls a first portion of the total output current of the $X^{th}$ delay stage 3-310-X. In an embodiment, the DAC code 324 corresponds to one or more analog values provided to the $X^{th}$ delay stage 3-310-X indicated by the Active Stage Indicator 320. The one or more analog values control a second portion of the total output current of the $X^{th}$ delay stage 3-310-X.

In another embodiment, the control logic 3-210 includes respective stage counts for each of a plurality of delay stages 3-310-1 to 3-310-n of the programmable delay line 3-202, and the Active Stage Count 322 corresponds to a one of the stage counts selected according by the Active Stage Indicator 320.

The programmable delay line 3-202 includes the plurality of delay stages 3-310-1, 3-310-2 . . . 3-310-n. FIG. 3 shows the programmable delay line 3-202 as including three delay stages 3-310, but embodiments are not limited thereto, and embodiments of the programmable delay line 3-202 include any of one, two, four, or more delay stages 3-310.

Each delay stage 3-310-i produces an $i^{th}$ first delayed clock CKi by delaying a i-$1^{th}$ delayed clock CK(i-1) according to a value of stage control signals SCTL[i,1 . . . 2m], for i=1,2. . . n. That is, the first delay stage 3-310-1 produces a first delayed clock CK1 by delaying an input clock CK0 (that is, an undelayed clock) by an interval corresponding to a value of first stage control signals SCTL[1,1 . . . 2m], the second delay stage 3-310-2 produces a second delayed clock CK2 by delaying the first delayed clock CK1 by an interval corresponding to a value of second stage control signals SCTL[2,1 . . . 2m], and an $n^{th}$ delay stage 3-310-n produces an $n^{th}$ delayed clock CKn by delaying the an n-$1^{th}$ delayed clock CKn-1 by an interval corresponding to a value of $n^{th}$ stage control signals SCTL[n,1 . . . 2m].

In an embodiment, each $i^{th}$ delay stage 3-310-i includes a plurality of enablable inverters connected in parallel, the enablable inverters each being enabled or disabled according to values of respective one or more $i^{th}$ stage control signals SCTL[i,1 . . . 2m]. In an embodiment, the control signals SCTL[1 . . . n,1 . . . 2m] are thermometer coded. In another embodiment, the control signals SCTL[1 . . . n,1 . . . 2m] are hybrid thermometer-binary coded, that is, the SCTL[1 . . . n,1 . . . 2m] include signals with thermometer coded values and signals with binary coded values.

In an embodiment, a drive strength of at least one of the enablable inverters is controlled by a value of at least one of the $i^{th}$ stage control signals SCTL[i,1 . . . 2m].

The delay used to generate the $i^{th}$ delayed clock CKi corresponds to the number of enablable inverters that are enabled, the drive strength of the at least one enable inverter, or both.

Figure 4:
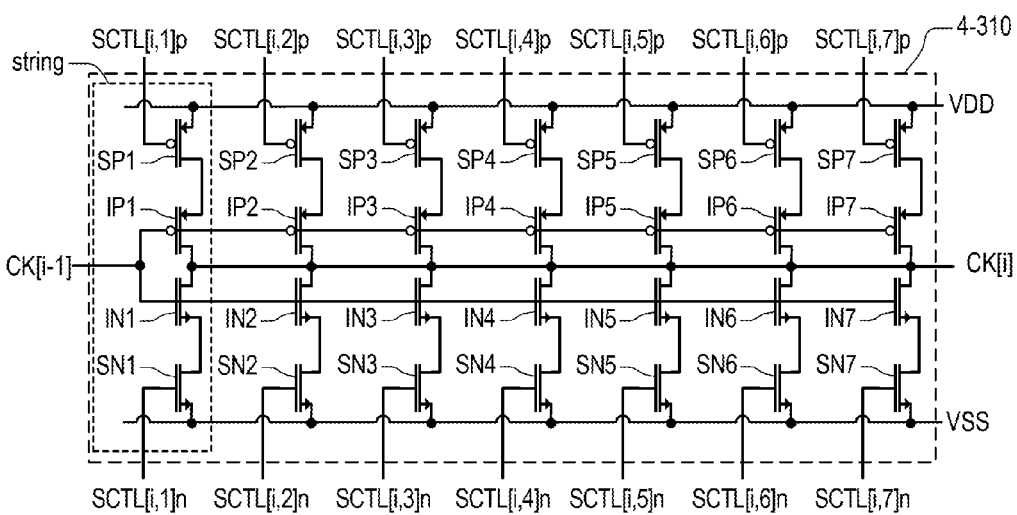
FIG. 4 illustrates a delay stage of a programmable delay line, according to an embodiment.

FIG. 4 illustrates an $i^{th}$ delay stage 4-310 of a programmable delay line, according to an embodiment. The $i^{th}$ delay stage 4-310 is suitable for use in any of the delay stages 3-310-1, 3-310-2 . . . 3-310-n of FIG. 3.

The $i^{th}$ delay stage 4-310 includes a plurality of strings of devices, each string corresponding to an enablable inverter. A first string includes a first switch p-channel Metal Oxide Semiconductor Field Effect Transistors (pMOSFET) SP1, a first inverter pMOSFET IP1, a first inverter n-channel Metal Oxide Semiconductor Field Effect Transistors (nMOSFET) IN1, and a first switch nMOSFET SN1.

A source of the first switch pMOSFET SP1 is coupled to a first supply voltage VDD. A gate of the first switch pMOSFET SP1 is coupled to a first p-channel $i^{th}$ stage control signal SCTL[i,1]p. A drain of the first switch pMOSFET SP1 is coupled to a source of the first inverter pMOSFET IP1. A gate of the first inverter pMOSFET IP1 is coupled to an delayed clock signal CK[i-1], that is to an input clock signal. A drain of the first inverter pMOSFET IP1 is coupled to an $i^{th}$ delayed clock signal CK[i], that is, to an output clock signal.

A drain of the first inverter nMOSFET IN1 is coupled to an $i^{th}$ delayed clock signal CK[i]. A gate of the first inverter nMOSFET IN1 is coupled to an i-$1^{th}$ delayed clock signal CK[i-1]. A source of the first inverter nMOSFET IN1 is coupled to a drain of the first switch nMOSFET SN1. A gate of the first switch nMOSFET SN1 is coupled to a first n-channel $i^{th}$ stage control signal SCTL[i,1]n. A source of the first switch nMOSFET SN1 is coupled to a second supply voltage VSS.

Second to seventh strings of the $i^{th}$ delay stage 4-310 respectively include second to seventh switch pMOSFETs SP2 to SP7, second to seventh inverter pMOSFETs IP2 to IP7, second to seventh inverter nMOSFETs IN2 to IN7, and second to seventh switch nMOSFET's SN2 to SN7. The MOSFETs of the second to seventh strings are respectively connected in the same manner as the MOSFETs of the first string.

Accordingly, gates of the second to seventh inverter pMOSFETs IP2 to IP7 and the second to seventh inverter nMOSFETs IN2 to IN7 are coupled to the i-$1^{th}$ delayed clock signal CK[i-1]. Drains of the second to seventh inverter pMOSFETs IP2 to IP7 and second to seventh inverter nMOSFETs IN2 to IN7 are coupled to the $i^{th}$ delayed clock signal CK[i].

Gates of the second to seventh switch pMOSFETs SP2 to SP7 are respectively coupled to second to seventh p-channel $i^{th}$ stage control signal SCTL[i,2 . . . 7]p. Gates of the second to seventh switch nMOSFETs SN2 to SN7 are respectively coupled to second to seventh n-channel $i^{th}$ stage control signals SCTL[i,2 . . . 7]n.

In an embodiment, the p-channel $i^{th}$ stage control signals SCTL[i,1 . . . 7]p are complementary to the n-channel $i^{th}$ stage control signals SCTL[i,1 . . . 7]n, respectively. That is, when a p-channel $i^{th}$ stage control signal SCTL[i,x]p has a high value, a corresponding n-channel $i^{th}$ stage control signal SCTL[i,x]n has a low value, and when the p-channel $i^{th}$ stage control signal SCTL[i,x]p has the low value, the corresponding n-channel $i^{th}$ stage control signal SCTL[i,x]n has the high value.

FIG. 4 illustrates the delay stage 4-310 as including 7 strings, each string including two p-channel Metal Oxide Semiconductor Field Effect Transistors (pMOSFETs) and two n-channel Metal Oxide Semiconductor Field Effect Transistors (nMOSFETs) coupled in series, but embodiments are not limited thereto, and may include any number of strings.

FIG. 4 illustrates the delay stage 4-310 including pMOSFETs and nMOSFETs, but embodiments are not limited thereto and may include other devices such as n-type or p-type Bipolar Junction Transistors (BJTs), n-channel or p-channel Junction Field Effect Transistors (JFETs), or other devices having three or more terminals and transconductance.

In an embodiment, the $i^{th}$ delay stage 4-310 is controlled using a thermometer code. Each of the switch pMOSFETs SP1 to SP7 are substantially identical, each of the inverter pMOSFETs IP1 to IP7 are substantially identical, each of the switch nMOSFETs SN1 to SN7 are substantially identical, and each of the inverter nMOSFETs IN1 to IN7 are substantially identical. As a result, each of the strings contributes a substantially identical drive current to the $i^{th}$ delayed clock signal CK[i] when turned completely on.

As a result, a normalized total drive current provided to the $i^{th}$ delayed clock signal CK[i] by the $i^{th}$ delay stage 4-310 is equal to $X_1+X_2+X_3+X_4+X_5+X_6+X_7$, wherein $X_z$ corresponds to a value of the $z^{th}$ p-channel $i^{th}$ stage control signals SCTL[i,z]p, a value of the $z^{th}$ n-channel $i^{th}$ stage control signals SCTL[i,z]n, or both. A delay of the $i^{th}$ delayed clock signal CK[i] relative to the i-$1^{th}$ delayed clock signal CK[i-1] is determined by the total drive current provided to and a capacitive load of the $i^{th}$ delayed clock signal CK[i].

In an embodiment, a string of the $i^{th}$ delay stage 4-310 is controlled by an analog value of corresponding $i^{th}$ stage control signals. For example, the first string composed of the first switch pMOSFET SP1, the first inverter pMOSFET IP1, the first switch nMOSFET SN1, the first inverter nMOSFET IN1 is, in the embodiment, controlled by respective analog values of the first n-channel $i^{th}$ stage control signal SCTL[i,1]n and the first p-channel $i^{th}$ stage control signal SCTL[i,1]p.

In an embodiment, the analog value of the first n-channel $i^{th}$ stage control signal SCTL[i,1]n is complementary to the analog value of the first p-channel $i^{th}$ stage control signal SCTL[i,1]p, that is, the analog value of the first n-channel $i^{th}$ stage control signal SCTL[i,1]n increases when the analog value of the first p-channel $i^{th}$ stage control signal SCTL[i,1]p decreases, and the analog value of the first n-channel $i^{th}$ stage control signal SCTL[i,1]n decreases when the analog value of the first p-channel $i^{th}$ stage control signal SCTL[i,1]p increases.

When the first string is controlled by the analog values, the drive current contributed to the $i^{th}$ delayed clock signal CK[i] by the first string varies between zero (when the string is disabled) and a fully-on current, according to the analog values. As a result, finer control of the delay of the $i^{th}$ delayed clock signal CK[i], relative to that achieved using only 1-bit binary signals, may be achieved by varying the analog values.

Figures 5, 6:
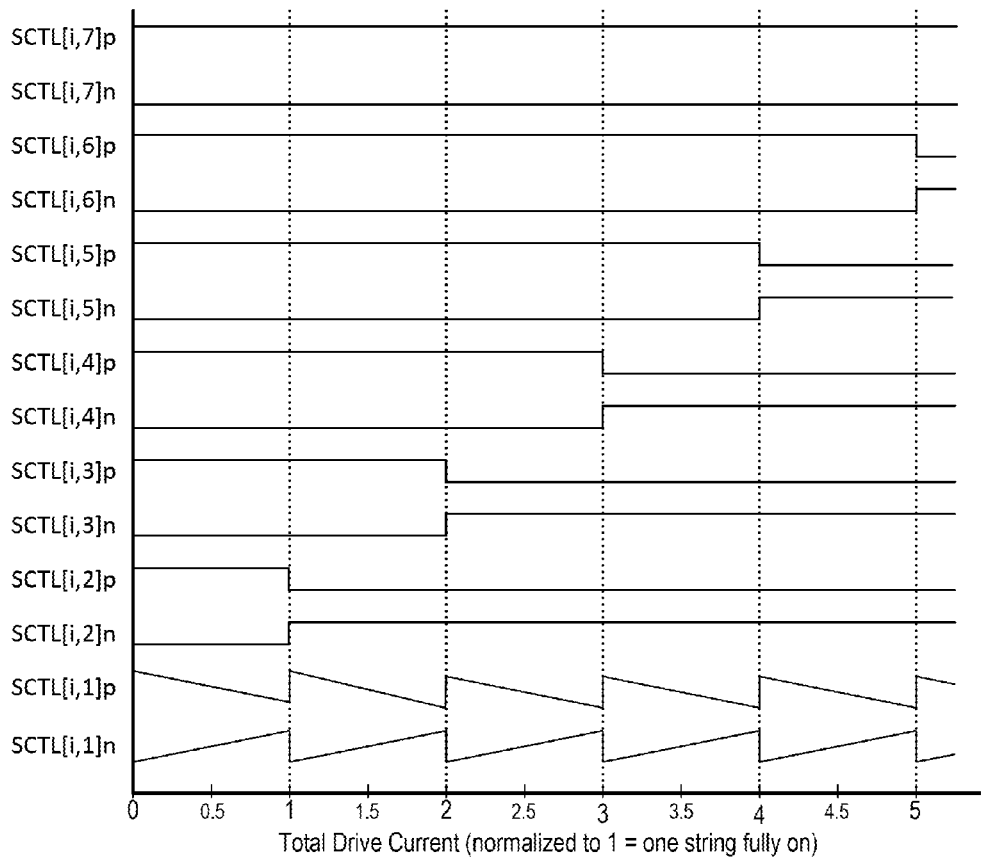
FIG. 5 is a graph illustrating operation of the delay stage of FIG. 4, according to an embodiment.
FIG. 6 includes a Table 1 showing stage control values for a DLL including three delay stages such as the delay stage of FIG. 4, according to an embodiment.

FIG. 5 is a graph illustrating operation of the $i^{th}$ delay stage 4-310 of FIG. 4, according to an embodiment. A horizontal access of the graph indicates a total drive current produced by the $i^{th}$ delay stage 4-310. The total drive current is normalized, with a value of one being equal to the drive current produced by a string when the string is completely turned on.

As shown in the graph, to produce a drive current of zero, all of the n-channel $i^{th}$ stage control signal SCTL[i,1 . . . 7]n are provided with low values and all of the p-channel $i^{th}$ stage control signal SCTL[i,1 . . . 7]p are provided with high values. As a result, all of the strings in the $i^{th}$ delay stage 4-310 are turned off and no drive current produced. Note that zero drive current corresponds to an infinite delay of the $i^{th}$ delayed clock signal CK[i]; that is, the $i^{th}$ delayed clock signal CK[i] would not be produced.

To reduce the delay when the first string of the $i^{th}$ delay stage 4-310 is not fully turned on, the total drive current is increased by increasing an analog value of the first n-channel $i^{th}$ stage control signal SCTL[i,1]n and decreasing an analog value of the first p-channel $i^{th}$ stage control signal SCTL[i,1]p. As a result, the drive current of a first string of the $i^{th}$ delay stage 4-310 will increase, decreasing the delay of the $i^{th}$ delayed clock signal CK[i].

When the first string of the $i^{th}$ delay stage 4-310 is fully turned on (that is, the total drive current is equal to 1) and an additional increase in the total drive current is desired, the second n-channel $i^{th}$ stage control signal SCTL[i,2]n may be provided with a high value, the second p-channel $i^{th}$ stage control signal SCTL[i,2]p may be provided with a low value, the analog value of the first n-channel $i^{th}$ stage control signal SCTL[i,1]n may be decreased, and the analog value of the first p-channel $i^{th}$ stage control signal SCTL[i,1]p may be increased. As a result, the second string of the $i^{th}$ delay stage 4-310 will turn fully on (providing one unit of drive current) and the first string of the $i^{th}$ delay stage 4-310 will provide a drive current between zero and one unit according to the respective analog values of the first n-channel $i^{th}$ stage control signal [i,1]n and the first p-channel $i^{th}$ stage control signal SCTL[i,1]p.

In an embodiment, further increases in the total drive current are obtained by turning on additional strings of the $i^{th}$ delay stage 4-310, as shown in FIG. 5.

FIG. 6 and FIG. 7 include a Table 1 and a Table 2, respectively, showing stage control values for the DLL 3-112 including delay stages 3-310-1 to 3-310-n each according to the embodiment of FIG. 4, according to an embodiment. In the example illustrated in FIGS. 6 and 7, the DLL 3-112 includes 3 stages, but embodiments are not limited thereto and may have any number of stages.

A delay value V corresponds to a total amount of delay provided by the programmable delay line 3-202. In an embodiment, the delay value V is monotonic (that is, a larger value of V corresponds to an increased amount of delay) but does not have a linear relationship to the total amount of delay.

The stage control values shown in FIGS. 6 and 7 correspond to a process for controlling the delay in which a first stage is controlled to provide a full range of delay of the first stage while the remaining stages provide respective minimum amounts of delay. In an embodiment, when the first stage is providing a maximum amount of delay of the first stage, the maximum delay being less than a delay provided by disabling all the strings, a second stage is controlled to provide additional delay as required. In an embodiment, when the second stage is providing a maximum amount of delay of the second stage, a third stage is controlled to provide additional delay, and so on.

For example, as shown in FIG. 6, to provide a minimum delay (V=0), the control logic 3-210 turns all the strings in all the stages fully on, by providing, using the mux circuit 3-214, a value (indicated in the table by a 0) corresponding to VSS to all of the p-channel stage control signals SCTL[1 . . . n,1 . . . m]p and a value (indicated by a 1) corresponding to VDD to all of the n-channel stage control signals SCTL[1 . . . n,1 . . . m]n.

To provide a delay between 0 and 7, then as shown in FIGS. 6 and 7, the control logic 3-210 controls the p-channel first stage control signals SCTL[1,1 . . . m]p and n-channel first stage control signals SCTL[1,1 . . . m]n to reduce the total drive current of the first delay stage 3-310-1, thus increasing the delay provided by the first delay stage 3-310-1.

The maximum delay provided by the first delay stage 3-310-1 corresponds to a minimum (non-zero) drive current provided by the first delay stage 3-310-1. In the embodiment shown in FIGS. 5 and 6, the minimum drive current provided by the first delay stage 3-310-1 corresponds to a drive current provided by having one string of the first delay stage 3-310-1 turned fully on and the other strings of the first delay stage 3-310-1 turned fully off.

In another embodiment, the minimum drive current provided by the first delay stage 3-310-1 corresponds to a drive current provided by having one string of the first delay stage 3-310-1 providing a current corresponding to a smaller value of the output of the DAC 3-212 that produces a non-zero drive current from the one string, and the other strings of the first delay stage 3-310-1 turned fully off.

In the embodiment shown in FIGS. 6 and 7, when the first delay stage 3-310-1 is providing the maximum delay of the first stage (in this embodiment, a delay value V of 6, the first delay stage 3-310-1 having six strings turned off and one string turned fully on), the control logic 3-210 controls the second delay stage 3-313-2 to provide additional delay. When both the first and second delay stage 3-310-1 and 3-310-2 are providing their respective maximum delays, producing a delay value of 12, the control logic 3-210 controls the third delay stage 3-310-3 to provide additional delay.

FIG. 8 includes a Table 3 showing stage control values for the DLL 3-112 including delay stages 3-310-1 to 3-310-n according to the embodiment of FIG. 4, according to another embodiment. In the example illustrated in FIG. 8, the DLL 3-112 includes 3 stages, but embodiments are not limited thereto and may have any number of stages.

A delay value V corresponds to a total amount of delay provided by the programmable delay line 3-202. In an embodiment, the delay value V is monotonic (that is, a larger value of V corresponds to an increased amount of delay) but does not have a linear relationship to the total amount of delay.

In the embodiment of FIG. 8, the control logic 3-210 increases a total delay provided by the programmable delay line 3-202 by first controlling the stage control signals to decrease a drive current of a first string in a first delay stage 3-310-1.

When the drive current of the first string in the first delay stage 3-310-1 is reduced to zero (that is, the first string in a first delay stage is turned off) and the total delay is to be increased, in an embodiment the control logic 3-210 increases the total delay by controlling the stage control signals to decrease a drive current of a first string in a second delay stage 3-310-2.

Accordingly, when the drive current of the first string in the i-$1^{th}$ delay stage 3-310-(i-1) is reduced to zero and the total delay is to be increased, in an embodiment, the control logic 3-210 increases the total delay by controlling the stage control signals to decrease a drive current of a first string in an $i^{th}$ delay stage 3-310-i, for i≤n.

When the drive current of the first string in the $n^{th}$ delay stage 3-310-n is reduced to zero and the total delay is to be increased, in an embodiment, the control logic control logic 3-210 increases the total delay by controlling the stage control signals to decrease a drive current of a second string of the first delay stage 3-310-1, and then a second string of the second delay stage 3-310-2, and so on, as described for the first strings above, and soon for each of third, fourth, fifth, sixth, and seventh strings of the respective delay stages 3-310 until respective maximum delays of all of the delay stages 3-310 are provided.

Accordingly, FIG. 8 shows that for delay values V between 0 and 1, the control logic 3-210 controls the drive current provided by a first string of the first delay stage 3-310-1. For delay values V between 1 and 2, the control logic 3-210 turns the first string of the first delay stage 3-310-1 off and controls the drive current provided by a first string of the second delay stage 3-310-2. For delay values V between 2 and 3, the control logic 3-210 turns the respective first strings of the first and second delay stages 3-310-1 and 3-310-2 off and controls the drive current provided by a first string of the third delay stage 3-310-3.

For delay values V between 3 and 4, the control logic 3-210 turns the respective first strings of the first, second, and third delay stages 3-310-1, 3-310-2, and 3-310-3 off and controls the drive current provided by a second string of the first delay stage 3-310-1. For delay values V between 4 and 5, the control logic 3-210 turns the respective first strings of the first, second, and third delay stages 3-310-1, 3-310-2, and 3-310-3 off, turns the second string of the first delay stage 3-310-1 off, and controls the drive current provided by a second string of the second delay stage 3-310-2. Large delay values V are provided by continuing the above-described process, as shown in FIG. 8.

Figures 9, 10:
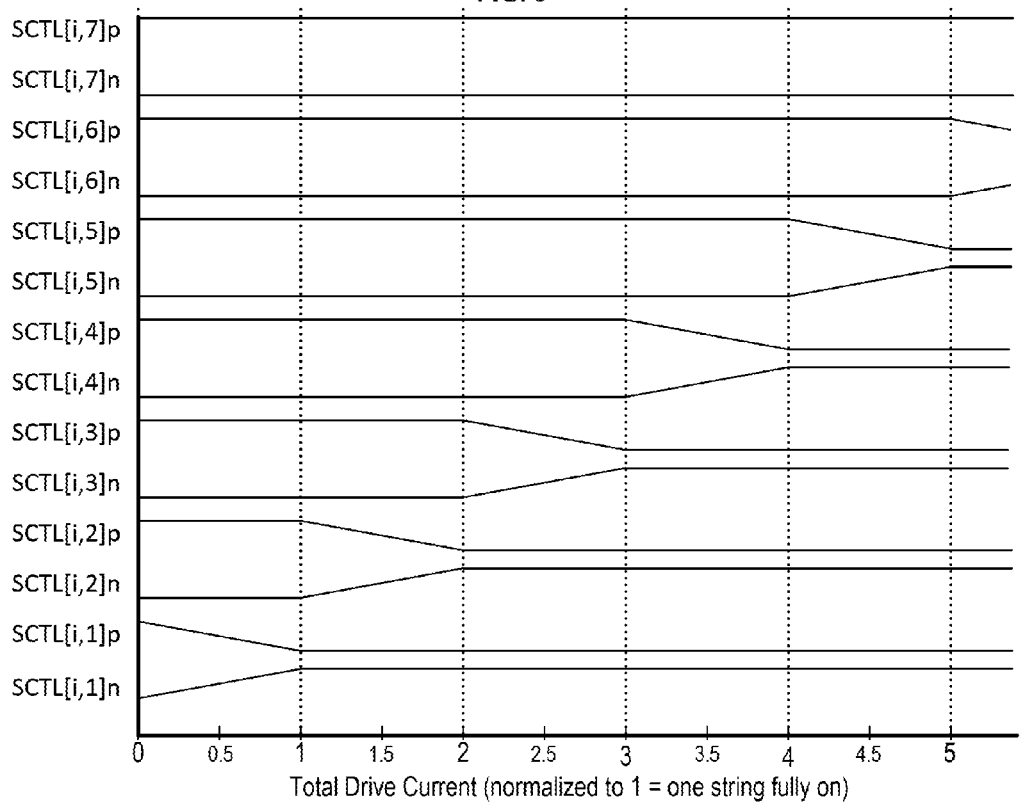
FIG. 9 is a graph illustrating operation of the delay stage of FIG. 4, according to another embodiment.
FIG. 10 includes a Table 4 showing stage control values for the delay stage of FIG. 4 as controlled as shown in FIG. 9, according to an embodiment.

FIG. 9 is a graph illustrating the operation of the $i^{th}$ delay stage 4-310 of FIG. 4 according to another embodiment. A horizontal access of the graph indicates a total drive current produced by the $i^{th}$ delay stage 4-310. The total drive current is normalized, with a value of one being equal to the drive current produced by a string when the string is completely turned on.

Compared to the embodiment whose operation is illustrated in FIG. 5, in which the analog signals produced by the ADC are only directed to a first string (via signals SCTL[i,1]n and SCTL[i,1]p), in the embodiment whose operation is illustrated in FIG. 9 the analog signals produced by the ADC are directed first to the first string (via signals SCTL[i,1]n and SCTL[i,1]p) until the first string is fully on, then to the second string (via signals SCTL[i,2]n and SCTL[i,2]p) until the second string is fully on, and so on. As a result, the embodiment whose operation is illustrated in FIG. 9 may avoid transients or non-monotonicity in the total drive current that may arise in the embodiment whose operation is illustrated in FIG. 5 when the analog signals return to their initial (string off) state and a new string is turned on.

As shown in the graph, to produce a drive current of zero, all of the n-channel $i^{th}$ stage control signal SCTL[i,1 . . . 7]n are provided with low values and all of the p-channel $i^{th}$ stage control signal SCTL[i,1 . . . 7]p are provided with high values. As a result, all of the strings in the $i^{th}$ delay stage 4-310 are turned off and no drive current produced. Note that zero drive current corresponds to an infinite delay of the $i^{th}$ delayed clock signal CK[i]; that is, the $i^{th}$ delayed clock signal CK[i] would not be produced.

To reduce the delay when the first string of the $i^{th}$ delay stage 4-310 is not fully turned on, the total drive current is increased by increasing an analog value of the first n-channel $i^{th}$ stage control signal SCTL[i,1]n and decreasing in analog value of the first p-channel $i^{th}$ stage control signal SCTL[i,1]p. As a result, the drive current of a first string of the $i^{th}$ delay stage 4-310 will increase, decreasing the delay of the $i^{th}$ delayed clock signal CK[i].

When the first string of the $i^{th}$ delay stage 4-310 is fully turned on (that is, the total drive current is equal to 1) and an additional increase in the total drive current is desired, the first n-channel $i^{th}$ stage control signal SCTL[i,1]n is set to a high value (such as VDD) and the first p-channel $i^{th}$ stage control signal SCTL[i,1]p is set to a low value (such as VSS) to maintain the first string of the $i^{th}$ delay stage 4-310 in the fully turn on state. An analog value of the second n-channel $i^{th}$ stage control signal SCTL[i,2]n is increased and an analog value of the second p-channel $i^{th}$ stage control signal SCTL[i,2]p is decreased, increasing the drive current provided by the second string of the $i^{th}$ delay stage 4-310.

In an embodiment, further increases in the total drive current are obtained using additional strings in the manner described above, as shown in FIG. 9.

FIG. 10 includes a Table 4 showing stage control values for the $i^{th}$ delay stage 4-310 as controlled as shown in FIG. 9, according to an embodiment. In an embodiment, the values shown in FIG. 10 are used with the values shown in FIG. 6, instead of using the values of FIG. 7, to control a multi-stage programmable delay line such as the programmable delay line 3-112 of FIG. 3.

A delay value V corresponds to a total amount of delay provided by the $i^{th}$ delay stage 4-310. In an embodiment, the delay value V is monotonic (that is, a larger value of V corresponds to an increased amount of delay) but does not have a linear relationship to the total amount of delay.

For example, as shown in FIG. 10, to provide a minimum delay (V=0), the control logic 3-210 turns all the strings of the $i^{th}$ delay stage 4-310 fully on, by providing, using the mux circuit 3-214, a value (indicated in the table by a 0) corresponding to a second supply voltage VSS to all of the p-channel $i^{th}$ stage control signals SCTL[i,7 . . . 1]p and a value (indicated by a 1) corresponding to a first supply voltage VDD to all of the n-channel $i^{th}$ stage control signals SCTL[i,7 . . . 1]n.

To provide a delay between 0 and 1, the control logic 3-210 provides analog values X and Y to first p-channel $i^{th}$ stage control signal SCTL[i,1]p and first n-channel $i^{th}$ stage control signal SCTL[i,1]n, respectively, to reduce the total drive current of the $i^{th}$ delay stage 4-310, thus increasing the delay provided by the $i^{th}$ delay stage 4-310. The analog values X and Y are each between the first supply voltage VDD and the second supply voltage VSS.

To provide a delay between 1 and 2, the control logic 3-210 turns the first string of the $i^{th}$ delay stage 4-310 off by setting the first n- and p-channel $i^{th}$ stage control signals SCTL[i,1]n and SCTL[i,1]p to the second supply voltage VSS and the first supply voltage VDD, respectively, and provides analog values X and Y to the second p-channel $i^{th}$ stage control signal SCTL [i,2]p and second n-channel $i^{th}$ stage control signals SCTL[i,2]n, respectively, to reduce the total drive current of the $i^{th}$ delay stage 4-310, thus increasing the delay provided by the $i^{th}$ delay stage 4-310. The analog values X and Y are each between the first supply voltage VDD and the second supply voltage VSS.

Additional delay is provided by continuing in a similar fashion, as shown in FIG. 10.

Figure 11:
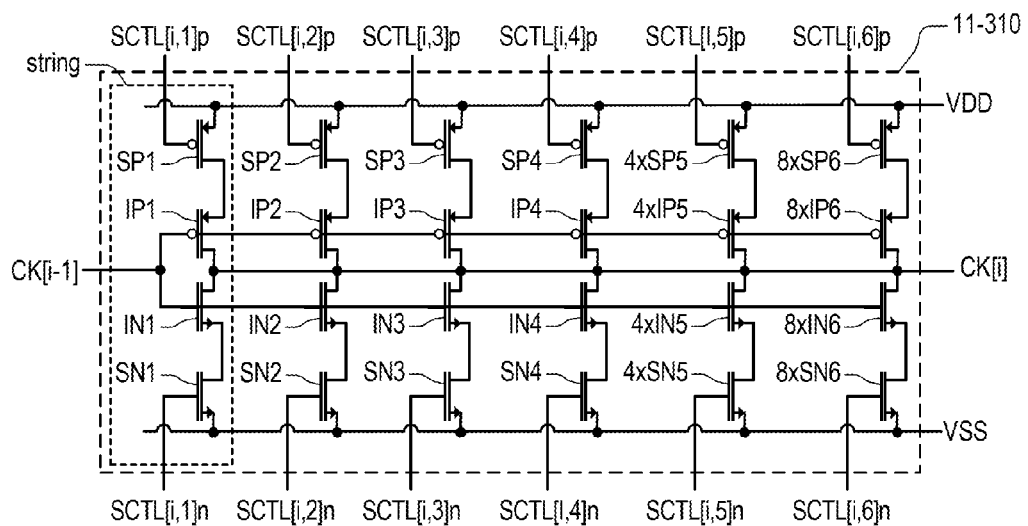
FIG. 11 illustrates an delay stage of a programmable delay line, according to another embodiment.

FIG. 11 illustrates an $i^{th}$ delay stage 11-310 according to another embodiment. The $i^{th}$ delay stage 11-310 is suitable for use in embodiments of any of the delay stages 3-310-1, 3-310-2 . . . 3-310-n of FIG. 3.

The $i^{th}$ delay stage 11-310 includes a plurality of strings, each string corresponding to an enablable inverter. A first string includes a first switch p-channel Metal Oxide Semiconductor Field Effect Transistors (pMOSFET) SP1, a first inverter pMOSFET IP1, a first inverter n-channel Metal Oxide Semiconductor Field Effect Transistors (nMOSFET) IN1, and a first switch nMOSFET SN1.

A source of the first switch pMOSFET SP1 is coupled to a first supply voltage VDD. A gate of the first switch pMOSFET SP1 is coupled to a first p-channel $i^{th}$ stage control signal SCTL[i,1]p. A drain of the first switch pMOSFET SP1 is coupled to a source of the first inverter pMOSFET IP1. A gate of the first inverter pMOSFET IP1 is coupled to an i-$1^{th}$ delayed clock signal CK[i-1], that is, to an input clock signal. A drain of the first inverter pMOSFET IP1 is coupled to an $i^{th}$ delayed clock signal CK[i], that is, to an output clock signal.

A drain of the first inverter nMOSFET IN1 is coupled to an $i^{th}$ delayed clock signal CK[i]. A gate of the first inverter nMOSFET IN1 is coupled to an i-$1^{th}$ delayed clock signal CK[i-1]. A source of the first inverter nMOSFET IN1 is coupled to a drain of the first switch nMOSFET SN1. A gate of the first switch nMOSFET SN1 is coupled to a first n-channel $i^{th}$ stage control signal SCTL[i,1]n. A source of the first switch nMOSFET SN1 is coupled to a second supply voltage VSS.

Second to fourth strings of the $i^{th}$ delay stage 11-310 respectively include second to fourth switch pMOSFETs SP2 to SP4, second to fourth inverter pMOSFETs IP2 to IP4, second to fourth inverter nMOSFETs IN2 to IN4, and second to fourth switch nMOSFETs SN2 to SN4. The MOSFETs of the second to fourth strings are respectively connected in the same manner as the MOSFETs of the first string.

Gates of the second to fourth inverter pMOSFETs IP2 to IP4 and the second to fourth inverter nMOSFETs IN2 to IN4 are coupled to the $i^{th}$ delayed clock signal CK[i-1]. Drains of the second to fourth inverter pMOSFETs IP2 to IP4 and second to fourth inverter nMOSFETs IN2 to IN4 are coupled to the $i^{th}$ delayed clock signal CK[i].

Gates of the second to fourth switch pMOSFETs SP2 to SP4 are respectively coupled to second to fourth p-channel $i^{th}$ stage control signal SCTL[i,2 . . . 4]p. Gates of the second to fourth switch nMOSFETs SN2 to SN4 are respectively coupled to second to fourth n-channel $i^{th}$ stage control signals SCTL[i,2 . . . 4]n.

A fifth string of the $i^{th}$ delay stage 11-310 includes a fifth switch pMOSFET 4×SP5, a fifth inverter pMOSFET 4×IP5, a fifth inverter nMOSFET 4×IN5, and a fifth switch nMOSFET 4×SN5. The MOSFETs of the fifth string are coupled together in the same manner as the MOSFETs of the first string.

Gates of the fifth inverter pMOSFET 4×IP5 and the fifth inverter nMOSFET 4×IN5 are coupled to the i-$1^{th}$ delayed clock signal CK[i-1]. Drains of the fifth inverter pMOSFET 4×IP5 and the fifth inverter nMOSFET 4×IN5 are coupled to the $i^{th}$ delayed clock signal CK[i].

A gate of the fifth switch pMOSFET 4×SP5 is coupled to a fifth p-channel $i^{th}$ stage control signal SCTL[i,5]p. A gate of the fifth switch nMOSFET 4×SN5 is coupled to a fifth n-channel $i^{th}$ stage control signals SCTL[i,5]n.

A sixth string of the $i^{th}$ delay stage 11-310 includes a sixth switch pMOSFET 8×SP6, a sixth inverter pMOSFET 8×IP6, a sixth inverter nMOSFET 8×IN6, and a sixth switch nMOSFET 8×SN6. The MOSFETs of the sixth string are coupled together in the same manner as the MOSFETs of the first string.

Gates of the sixth inverter pMOSFET 4×IP5 and the sixth inverter nMOSFET 8×IN6 are coupled to the i-$1^{th}$ delayed clock signal CK[i-1]. Drains of the sixth inverter pMOSFET 8×IP6 and the sixth inverter nMOSFET 4×IN5 are coupled to the $i^{th}$ delayed clock signal CK[i].

A gate of the sixth switch pMOSFET 8×SP6 is coupled to a sixth p-channel $i^{th}$ stage control signal SCTL[i,6]p. A gate of the sixth switch nMOSFET 8×SN6 is coupled to a sixth n-channel $i^{th}$ stage control signals SCTL[i,6]n.

In an embodiment, the p-channel $i^{th}$ stage control signals SCTL[i,1 . . . 6]p are complementary to the n-channel $i^{th}$ stage control signals SCTL[i,1 . . . 6]n, respectively. That is, when a p-channel $i^{th}$ stage control signal SCTL[i,x]p has a high value, a corresponding n-channel $i^{th}$ stage control signal SCTL[i,x]n has a low value, and when the p-channel $i^{th}$ stage control signal SCTL[i,x]p has the low value, the corresponding n-channel $i^{th}$ stage control signal SCTL[i,x]n has the high value.

As seen in FIG. 11 the delay stage 11-310 is illustrated as including 6 strings, each string including two pMOSFETs and two nMOSFETs all coupled in series, but embodiments are not limited thereto, and may include any number of strings.

Additionally, FIG. 11 illustrates the delay stage 11-310 as including pMOSFETs and nMOSFETs, but embodiments are not limited thereto and may include other devices such as n-type or p-type Bipolar Junction Transistors (BJTs), n-channel or p-channel Junction Field Effect Transistors (JFETs), or other devices having three or more terminals and transconductance.

In an embodiment, the $i^{th}$ delay stage 11-310 is controlled using a hybrid thermometer code, that is, a code including a plurality of thermometer coded values and a plurality of binary coded values. In the embodiment, the first to fourth p-channel $i^{th}$ stage control signals SCTL[i,1 . . . 4]p are encoded using thermometer code wherein each signal has a weight of one, the fifth p-channel $i^{th}$ stage control signals SCTL[i,5]p has a weight of four, and the sixth p-channel $i^{th}$ stage control signals SCTL[i,5]p has a weight of eight. The first to sixth n-channel $i^{th}$ stage control signals SCTL[i,1 . . . 6]n are complementary signals of and have the same weights as the respective first to sixth p-channel $i^{th}$ stage control signals SCTL[i,1 . . . 6]p.

Accordingly, each of the switch pMOSFETs SP1 to SP4 are substantially identical, each of the inverter pMOSFETs IP1 to IP4 are substantially identical, each of the switch nMOSFETs SN1 to SN4 are substantially identical, and each of the inverter nMOSFETs IN1 to IN4 are substantially identical. As a result, each of the first to fourth strings contributes a substantially identical drive current (having a normalized value of 1) to the $i^{th}$ delayed clock signal CK[i] when turned completely on.

The fifth switch pMOSFETs 4×SP5, the fifth inverter pMOSFETs 4×IP5, fifth inverter nMOSFETs 4×IN5, and fifth switch nMOSFETs 4×SN5 of the fifth string each have drive strengths four times that of the corresponding MOSFETs in the first string. As a result, the fifth string contributes drive current four times that of the first string (i.e., a drive current having a normalized value of 4) to the $i^{th}$ delayed clock signal CK[i] when turned completely on, and reduces the delay by a greater amount when turned on than turning on the first string would.

In embodiment, the MOSFETs of the fifth string have gate widths four times gate lengths of the corresponding MOSFETs in the first string. In an embodiment, each of the MOSFETs of the fifth string is comprised of four MOSFETs, coupled in parallel, that are each substantially identical to the corresponding MOSFET of the first string.

The sixth switch pMOSFETs 8×SP6, the sixth inverter pMOSFETs 8×IP6, sixth inverter nMOSFETs 8×IN6, and sixth switch nMOSFETs 8×SN6 of the sixth string each have drive strengths four times that of the corresponding MOSFETs in the first string. As a result, the fifth string contributes a drive current eight times that of the first string (i.e., a drive current having a normalized value of 8) to the $i^{th}$ delayed clock signal CK[i] when turned completely on, and reduces the delay by a greater amount when turned on than turning on the first or fifth string would In embodiment, the MOSFETs of the sixth string have gate widths eight times gate widths of the corresponding MOSFETs in the first string. In an embodiment, each of the MOSFETs of the sixth string is comprised of eight MOSFETs, coupled in parallel, that are each substantially identical to the corresponding MOSFET of the first string.

As a result, a normalized total drive current provided to the $i^{th}$ delayed clock signal CK[i] by the $i^{th}$ delay stage 11-310 is equal to $X_1+X_2+X_3+X_4+4\times X_5+8\times X_6$, wherein $X_z$ corresponds to a value of the $z^{th}$ p-channel $i^{th}$ stage control signals SCTL[i,z]p, a value of the $z^{th}$ n-channel $i^{th}$ stage control signals SCTL[i,z]n, or both. A delay of the $i^{th}$ delayed clock signal CK[i] relative to the i-$1^{th}$ delayed clock signal CK[i-1] is determined by the total drive current provided to and a capacitive load of the $i^{th}$ delayed clock signal CK[i].

FIG. 11 shows an embodiment having four pairs of thermometer-coded control signals (first to fourth p- and n-channel $i^{th}$ stage control signals SCTL[i,1 . . . 4]p and SCTL[i,1 . . . 4]n) and two pairs of binary coded control signals (fifth and sixth p- and n-channel $i^{th}$ stage control signals SCTL[i,5 . . . 6]p and SCTL[i,5 . . . 6]n) but embodiments are not limited thereto, and may have any number of thermometer- and binary-coded control signal pairs.

In an embodiment, a string of the $i^{th}$ delay stage 11-310 is controlled by an analog value. For example, in an embodiment, the first string of the $i^{th}$ delay stage 11-310 (composed of the first switch pMOSFET SP1, the first inverter pMOSFET IP1, the first switch nMOSFET SN1, the first inverter nMOSFET IN1) are controlled by respective analog values of the first n-channel $i^{th}$ stage control signal SCTL[i,1]n and the first p-channel $i^{th}$ stage control signal SCTL[i,1]p.

In an embodiment, the value of the first n-channel $i^{th}$ stage control signal SCTL[i,1]n is complementary to the value of the first p-channel $i^{th}$ stage control signal SCTL[i,1]p, that is, the analog value of the first n-channel $i^{th}$ stage control signal SCTL[i,1]n increases when the analog value of the first p-channel $i^{th}$ stage control signal SCTL[i,l]p decreases, and the analog value of the first n-channel $i^{th}$ stage control signal SCTL[i,1 ]n decreases when the analog value of the first p-channel $i^{th}$ stage control signal SCTL[i,7]p increases.

When the first string is controlled by the analog values, the drive current contributed to the $i^{th}$ delayed clock signal CK[i] by the first string varies between zero (when the string is disabled) and a fully-on current, according to the analog values. As a result, in an embodiment, finer control of the delay of the $i^{th}$ delayed clock signal CK[i], compared to using only 1-bit digital signals, is achieved by varying the analog values.

Figure 12:
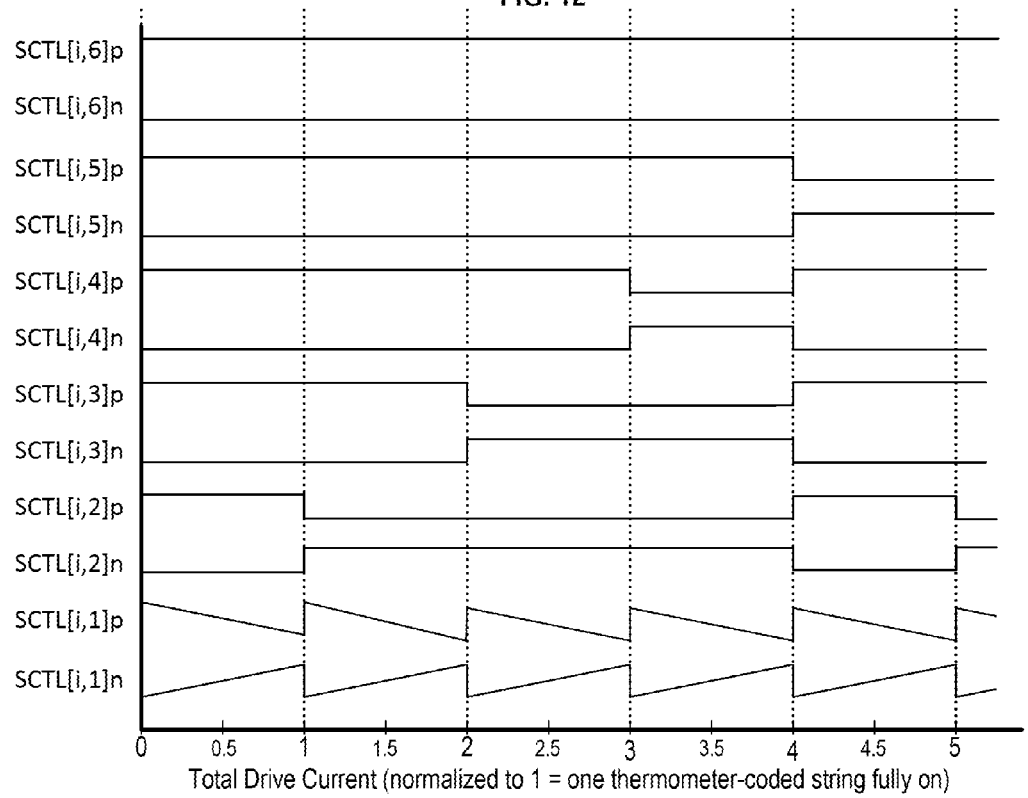
FIG. 12 is a graph illustrating operation of the delay stage of FIG. 11, according to an embodiment.

FIG. 12 is a graph illustrating the operation of the $i^{th}$ delay stage 11-310 of FIG. 11 according to an embodiment. A horizontal access of the graph indicates a total drive current produced by the $i^{th}$ delay stage 11-310. The total drive current is normalized, with a value of one being equal to the drive current produced by a first string when the first string is completely turned on.

As shown in the graph, to produce a drive current of zero, all of the n-channel $i^{th}$ stage control signal SCTL[i,1 . . . 6]n are provided with low values and all of the p-channel $i^{th}$ stage control signal SCTL[i,1 . . . 7]p are provided with high values. As a result, all of the strings in the $i^{th}$ delay stage 11-310 are turned off and no drive current produced. Note that zero drive current corresponds to an infinite delay of the $i^{th}$ delayed clock signal CK[i]; that is, the $i^{th}$ delayed clock signal CK[i] would not be produced.

To reduce the delay when the first string of the $i^{th}$ delay stage 11-310 is not fully turned on, the total drive current is increased by increasing an analog value of the first n-channel $i^{th}$ stage control signal SCTL[i,1]n and decreasing an analog value of the first p-channel $i^{th}$ stage control signal SCTL[i,1]p. As a result, the drive current of a first string of the $i^{th}$ delay stage 11-310 will increase, decreasing the delay of the $i^{th}$ delayed clock signal CK[i].

When the first string of the $i^{th}$ delay stage 11-310 is fully turned on (that is, the total drive current is equal to 1) and an additional increase in the total drive current is desired, the second n-channel $i^{th}$ stage control signal SCTL[i,2]n is provided with a high value, the second p-channel $i^{th}$ stage control signal SCTL[i,2]p is provided with a low value, the analog value of the first n-channel $i^{th}$ stage control signal SCTL[i,1]n is decreased, and the analog value of the first p-channel $i^{th}$ stage control signal SCTL[i,1]p is increased. As a result, the second string of the $i^{th}$ delay stage 11-310 will turn fully on (providing one unit of drive current) and the first string of the $i^{th}$ delay stage 11-310 will provide a drive current between zero and one unit according to the respective analog values of the first n-channel $i^{th}$ stage control signal SCTL[i,1]n and the first p-channel $i^{th}$ stage control signal SCTL[i,1]p.

When a total drive current less than 4 is to be produced, further increases in the total drive current are obtained by turning on one or more of the second, third, and fourth strings of the $i^{th}$ delay stage 11-310, as shown in FIG. 12.

When a total drive current of greater than or equal to four and less than eight is to be provided, the fifth n-channel $i^{th}$ stage control signal SCTL[i,5]n is provided with a high value and the fifth p-channel $i^{th}$ stage control signal SCTL[i,5]p is provided with a low value, and as a result the fifth string of the $i^{th}$ delay stage 11-310 is turned fully on, thereby contributing a drive current having a normalized value of four (4) to the total drive current. The first 10 fourth n- and p-channel $i^{th}$ stage control signal SCTL[i,1 ... 4]n and SCTL[i,1 ... 4]n are controlled to provide additional total drive currents in the same manner as when the total drive current was less than four.

When a total drive current of greater than or equal to eight is to be provided, the sixth n-channel $i^{th}$ stage control signal SCTL[i,6]n is provided with a high value and the six p-channel $i^{th}$ stage control signal SCTL[i,6]p is provided with a low value, and as a result the sixth string of the $i^{th}$ delay stage 11-310 is turned fully on, thereby contributing a drive current having a normalized value of eight (8) to the total drive current. The first to fifth n- and p-channel $i^{th}$ stage control signal SCTL[i,1 ... 5]n and SCTL[i,1 ... 5]n are controlled to provide additional total drive currents in the same manner as when the total drive current was less than eight.

FIG. 13 includes a Table 5 showing stage control values for the $i^{th}$ delay stage 11-310 as controlled as shown in FIG. 12, according to an embodiment. In an embodiment, the values shown in FIG. 13 are used with the values shown in FIG. 6, instead of using the values of FIG. 7, to control a multi-stage programmable delay line such as the programmable delay line 3-112 of FIG. 3 when one or more delay stages of the programmable delay line include the $i^{th}$ delay stage 11-310.

A delay value V corresponds to a total amount of delay provided by the $i^{th}$ delay stage 11-310. In an embodiment, the delay value V is monotonic (that is, a larger value of V corresponds to an increased amount of delay) but does not have a linear relationship to the total amount of delay.

For example, as shown in FIG. 13, to provide a minimum delay (V×0), the control logic 3-210 turns all the strings of the $i^{th}$ delay stage 4-310 fully on, by providing, using the mux circuit 3-214, a value (indicated in the table by a 0) corresponding to a second supply voltage VSS to all of the p-channel $i^{th}$ stage control signals SCTL[i,6 ... 1]p and a value (indicated by a 1) corresponding to a first supply voltage VDD to all of the n-channel $i^{th}$ stage control signals SCTL[i,6 ... 1]n.

To provide a delay between 0 and 1, the control logic 3-210 provides analog values X and Y to first p-channel $i^{th}$ stage control signal SCTL[i,1]p and first n-channel $i^{th}$ stage control signal SCTL[i,1]n, respectively, to reduce the total drive current of the $i^{th}$ delay stage 4-310, thus increasing the delay provided by the $i^{th}$ delay stage 4-310. The analog values X and Y are each between the first supply voltage VDD and the second supply voltage VSS.

To provide a delay between 4 and 5, the control logic 3-210 turns the fifth string of the $i^{th}$ delay stage 4-310 off by setting the fifth n- and p-channel $i^{th}$ stage control signals SCTL[i,5]p and SCTL[i,5]p to the second supply voltage VSS and the first supply voltage VDD, respectively, provides analog values X and Y to the first p-channel $i^{th}$ stage control signal [i,1]p and first n-channel $i^{th}$ stage control signals SCTL[i,1]n, respectively, and leaves all the other strings turned on, thereby reducing the total drive current of the $i^{th}$ delay stage 4-310, thus increasing the delay provided by the $i^{th}$ delay stage 4-310. The analog values X and Y are each between the first supply voltage VDD and the second supply voltage VSS.

Other values of delay are provided in a similar manner, as shown in FIG. 13.

Figure 14:
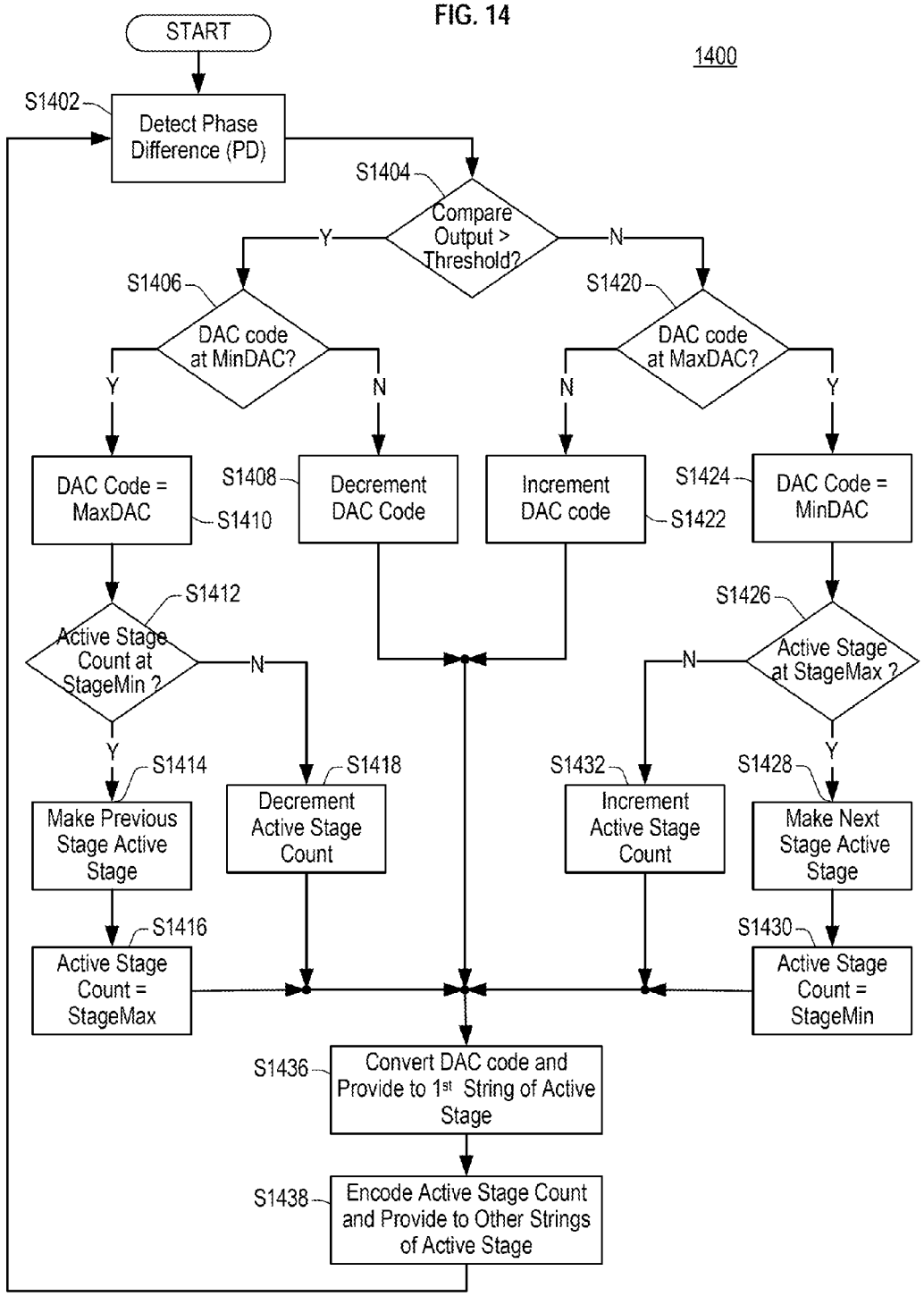
FIG. 14 shows a process for operating a delay locked loop, according to an embodiment.

FIG. 14 illustrates a process 1400 for operating a Delay Locked Loop (DLL) according to an embodiment.

At S1402, the process 1400 detects, using a phase detector circuit, a phase difference (PD) between an input clock and an output clock of the DLL.

At S1404, the process 1400 compares the detected phase difference to a threshold. When the phase difference is greater than the threshold, the process 1400 proceeds to S1406. Otherwise, at S1404 the process 1400 proceeds to S1420.

At S1406, the process 1400 determine whether a DAC Code has a value equal to a predetermined minimum DAC (MinDAC) value. In an embodiment, the DAC code corresponds to a value to be provided to a Digital to Analog Converter (DAC) circuit of the DLL. When the DAC Code is equal to the MinDAC value, the process 1400 proceeds to S1410. Otherwise, at S1406 the process 1400 proceeds to S1408.

At S1408, the process 1400 decrements the DAC Code by a predetermined value (for example, 1). The process 1400 then proceeds to S1436.

At S1410, the process 1400 sets the DAC Code to a predetermined maximum DAC (MaxDAC) value.

At S1412, the process 1400 determines whether an Active Stage Count has a value equal to a predetermined minimum stage (StageMin) value. In an embodiment, the Active Stage Count corresponds to a control value to be provided to a delay stage of a programmable delay line of the DLL.

In an embodiment, the StageMin value is zero. In an embodiment, the StageMin value corresponds to the smallest non-zero total drive current that a delay stage of a programmable delay line is capable of producing.

When the Active Stage Count is equal to the StageMin value, the process 1400 proceeds to S1414. Otherwise, at S1412 the process 1400 proceeds to S1418.

At S1414, the process 1400 sets an Active Stage indicator to indicate a previous delay stage of the programmable delay line, the previous delay stage being a delay stage that is immediately before (that is, provides a signal to) a delay stage currently indicated by the Active Stage indicator.

At S1416, the process 1400 sets the Active Stage Count to a predetermined maximum stage StageMax value. In an embodiment, the StageMax value corresponds to the largest total drive current that a delay stage of the programmable delay line is capable of producing. The process 1400 then proceeds to S1436.

At S1418, the process 1400 decrements the Active Stage Count by a predetermined value (such as 1). The process 1400 then proceeds to S1436.

At S1420, the process 1400 determines whether a DAC Code has a value equal to the MaxDAC value. When the DAC Code is equal to the MaxDAC value, the process 1400 proceeds to S1424. Otherwise, at S1420 the process 1400 proceeds to S1422.

At S1422, the process 1400 increments the DAC Code by a predetermined value (for example, 1). The process 1400 then proceeds to S1436.

At S1424, the process 1400 sets the DAC Code to the MinDAC value.

At S1426, the process 1400 determines whether the Active Stage Count has a value equal to the StageMax value. When the Active Stage Count is equal to the StageMax value, the process 1400 proceeds to S1428. Otherwise, at S1426 the process 1400 proceeds to S1432.

At S1428, the process 1400 sets an Active Stage indicator to indicate a next delay stage of the programmable delay line, the next delay stage being a delay stage that is immediately after (that is, receives a signal from) the delay stage currently indicated by the Active Stage indicator.

At S1430, the process 1400 sets the Active Stage Count to the StageMin value. The process 1400 then proceeds to S1436.

At S1432, the process 1400 increments the Active Stage Count by a predetermined value (such as 1). The process 1400 then proceeds to S1436.

At S1436, the process 1400 converts, using a DAC circuit, the DAC Code to one or more analog values and provides the analog values to a first suing of a delay stage of the programmable delay line, the delay stage being indicated by the Active Stage indicator. In an embodiment, the analog values include complementary values of a differential analog signal pair.

As S1438, the process 1400 encodes the Active Stage Count into a plurality of control signals and provides the control signals to a one or more strings of the delay stage being indicated by the Active Stage indicator, where in the one or more strings does not include the first string. In an embodiment the process 1400 encodes the Active Stage Count using binary encoding, thermometer encoding, or a combination thereof. In an embodiment, the process 1400 encodes the Active Stage Count into a plurality of complimentary signals.

FIG. 15 illustrates a process 1500 for operating a Delay Locked Loop (DLL) according to another embodiment.

At S1502, the process 1500 detects, using a phase detector circuit, a phase difference (PD) between an input clock and an output clock of the DLL.

At S1504, the process 1500 compares the detected phase difference to a threshold. When the phase difference is greater than the threshold, the process 1500 proceeds to S1506. Otherwise, at S1504 the process 1500 proceeds to S1520.

At S1506, the process 1500 determines whether a DAC Code has a value equal to a predetermined minimum DAC (MinDAC) value. In an embodiment, the DAC code corresponds to a value to be provided to a Digital to Analog Converter (DAC) circuit of the DLL. When the DAC Code is equal to the MinDAC value, the process 1500 proceeds to S1510. Otherwise, at S1506 the process 1500 proceeds to S1508.

At S1508, the process 1500 decrements the DAC Code by a predetermined value (for example, 1). The process 1500 then proceeds to S1536.

At S1510, the process 1500 sets the DAC Code to a predetermined maximum DAC (MaxDAC) value.

At S1512, the process 1500 determines whether an Active Stage indicator indicates a first delay stage of a programmable delay line. In an embodiment, the first delay stage is a delay stage receiving the input clock. When the Active Stage indicator indicates the first delay stage, the process 1500 proceeds to S1516. Otherwise, at S1506 the process 1500 proceeds to S1514.

At S1514, the process 1500 sets the Active Stage indicator to indicate a previous delay stage of the programmable delay line, the previous delay stage being a delay stage that is immediately before (that is provides a signal to) a delay stage currently indicated by the Active Stage indicator. The process 1500 then proceeds to S1536.

At S1516, the process 1500 sets the Active Stage indicator to indicate to indicate a last delay stage of the programmable delay line. In an embodiment, the last delay stage is a delay stage producing the output clock.

At S1518, the process 1500 decrements the Active Stage Count by a predetermined value (such as 1). The process 1500 then proceeds to S1536.

At S1520, the process 1500 determines whether a DAC Code has a value equal to the MaxDAC value. When the DAC Code is equal to the MaxDAC value, the process 1500 proceeds to S1524. Otherwise, at S1520 the process 1500 proceeds to S1522.

At S1522, the process 1500 increments the DAC Code by a predetermined value (for example, 1). The process 1500 then proceeds to S1536.

At S1524, the process 1500 sets the DAC Code to the MinDAC value.

At S1526, the process 1500 whether the Active Stage indicator indicates the last delay stage of the programmable delay line. When the Active stage indicator indicates the last delay stage, the process 1500 proceeds to S1530. Otherwise, at S1526 the process 1500 proceeds to S1528.

At S1528, the process 1500 sets an Active Stage indicator to indicate a next delay stage of the programmable delay line, the next delay stage being a delay stage that is immediately after (that is, receives a signal from) the delay stage currently indicated by the Active Stage indicator.

At S1530, the process 1500 sets the Active Stage indicator to indicate to indicate the first delay stage of the programmable delay line. The process 1500 then proceeds to S1536.

At S1532, the process 1500 increments the Active Stage Count by a predetermined value (such as 1). The process 1500 then proceeds to S1536.

At S1536, the process 1500 converts the DAC Code to one or more analog values and provides the analog values to a first string of a delay stage of the programmable delay line, the delay stage being indicated by the Active Stage indicator. In an embodiment, the analog values include complementary values of a differential analog signal pair.

As S1538, the process 1500 encodes the Active Stage Count into a plurality of control signals and provides the control signals to a one or more strings of the delay stage being indicated by the Active Stage indicator, where in the one or more strings does not include the first string. In an embodiment, the process 1500 encodes the Active Stage Count using binary encoding, thermometer encoding, or a combination thereof. In an embodiment, the process 1500 encodes the Active Stage Count into a plurality of complimentary signals.

Embodiments ease the limited timing range issue present in some analog DLL designs. Embodiments provide a DLL that is low power and has low jitter. Embodiments include DLLs with low clock duty cycle variations. Embodiments include DLLs with a large delay range.

In embodiments, a DLL power supply is fixed. In an embodiment, there is no need for level shifters and therefore the problems associated with level shifters do not arise.

In an embodiment, delay taps of the programmable delay line are selected according to a speed specification, a delay specification, or both.

Further aspects of the present disclosure relate to one or more of the following clauses.

In an embodiment, a programmable delay line comprises a delay stage responsive to an analog control signal and responsive to one or more digital control signals. The delay stage generates an output signal that is delayed relative to an input signal by a delay amount. The delay amount is according to a value of the analog control signal and one or more values of the one or more digital control signals.

In an embodiment, a change in the delay amount corresponding to a change in the value of the analog control signal is smaller than the smallest change in the delay amount that can be produced by a change in the values of the one or more digital control signals.

In an embodiment, the programmable delay line comprises a plurality of the delay stages. A delay produced by the programmable delay line corresponds to a sum of the delays amounts of the delay stages.

In an embodiment, the delay amount corresponds to an inverse of a total drive current of the delay stage. The analog control signal and the one or more digital control signals control the total drive current of the delay stage.

In an embodiment, the delay stage comprises a plurality of enablable inverters. Each of the one or more digital control signals controls whether a respective enablable inverter is on or off. The analog control signal controls a drive strength of a respective enablable inverter.

In an embodiment, the delay stage comprises, a first enablable inverter and a second enablable inverter. A maximum value of the portion of the total drive current provided by the second enablable inverter has a value substantially identical to a maximum value of the portion of the total drive current provided by the first enablable inverter.

In an embodiment, the delay stage further comprises a third enablable inverter. A maximum value of the portion of the total drive current provided by the third enablable inverter has a value substantially equal to a power of two multiplied by the maximum value of the portion of the total drive current provided by the first enablable inverter, the power of two being greater than one.

In an embodiment, the programmable delay line further comprises a phase detector circuit to determine a phase difference between the input signal and the output clock, a comparator circuit to produce an output according to a value of an output signal of the phase detector circuit and a predetermined reference value, a control logic circuit to produce a Digital to Analog Converter (DAC) code signal and a plurality of multiplexer control signals according to an output of the comparator circuit, a DAC circuit to produce one or more DAC output signals according to the DAC code signal, and a multiplexer circuit to produce the analog control signal and the one or more digital control signals according to values of the plurality of multiplexer control signals and values of the one or more DAC output signals.

In an embodiment, the control logic circuit is further to increase a value of the DAC code signal when the output of the comparator circuit has a first value; and decrease the value of the DAC code signal when the output of the comparator circuit has a second value, the second value being different from the first value.

In an embodiment, the control logic circuit is further to increase a value of a multiplexer control signal of the plurality of multiplexer control signals and set the value of the DAC code signal to a predetermined minimum DAC value when the output of the comparator circuit has the first value and the value of the DAC code signal is equal to a predetermined maximum DAC value, and decrease the value of the multiplexer control signal of the plurality of multiplexer control signals and set the value of the DAC code signal to the predetermined maximum DAC value when the output of the comparator circuit has the second value and the value of the DAC code signal is equal to the predetermined minimum DAC value.

In an embodiment, the delay stage is a first delay stage, and the control logic circuit is further to control the multiplexer circuit to provide the one or more DAC output signals to a second delay stage of the programmable delay line when the output of the comparator circuit has the first value and control signals corresponding to the first delay stage have a predetermined maximum stage value, and control the multiplexer circuit to provide the one or more DAC output signals to a third delay stage of the programmable delay line when the output of the comparator circuit has the second value and the control signals corresponding to the first delay stage of the programmable delay line have a predetermined minimum stage value. The third delay stage receives an output of the first delay stage, and the first delay stage receives an output of the second delay stage.

In an embodiment, a method for controlling a delay locked loop circuit comprises providing, to a programmable delay line of the delay locked loop circuit, a one or more digital signals, and providing, to the programmable delay line, an analog signal. A first portion of a delay produced by the programmable delay line corresponds to values of the one or more digital signals. A second portion of the delay produced by the programmable delay line corresponds to a value of the analog signal.

In an embodiment, the method further comprises increasing the value of the analog signal to increase the delay produced by the programmable delay line, and decreasing the value of the analog signal to decrease the delay produced by the programmable delay line.

In an embodiment, the method further comprises increasing a value of a digital signal and setting the value of the analog signal to a minimum analog value to increase the delay produced by the programmable delay line; and decreasing a value of a digital signal and setting the value of the analog signal to a maximum analog value to decrease the delay produced by the programmable delay line.

In an embodiment, the programmable delay line includes a plurality of delay stages, and the method further comprises when a first stage is an active stage and the first stage is providing a delay equal to a predetermined maximum delay value, selecting a second stage as the active stage to increase the delay produced by the programmable delay line, when the first stage is the active stage and the first stage is providing a delay equal to a predetermined minimum delay value, selecting a third stage as the active stage to decrease the delay produced by the programmable delay line, and providing the analog signal to the active stage. The second stage receives an output of the first stage and the third stage provides an input of the first stage, or the third stage receives an output of the first stage and the second stage provides an input of the first stage.

In an embodiment, the programmable delay line is an inverter-based delay line including a plurality of enablable inverters.

In an embodiment, the method further comprises increasing the delay produced by the programmable delay line programmable delay line by decreasing total drive currents respectively produced by one or more of the plurality of enablable inverters, and decreasing the delay produced by the programmable delay line programmable delay line by increasing total drive currents respectively produced by the one or more of the plurality of enablable inverters.

In an embodiment, the plurality of digital signals includes a thermometer coded signal having a plurality of bits.

In an embodiment, the plurality of digital signals includes a binary signal having a plurality of bits.

In an embodiment, the method further comprises determining a phase difference between an input of the programmable delay line and an output of the programmable delay line, comparing the phase difference to a predetermined threshold, increasing the delay produced by the programmable delay line when the phase difference is greater than the predetermined threshold, and decreasing the delay produced by the programmable delay line when the phase difference is less than the predetermined threshold.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A circuit comprising a programmable delay line, the programmable delay line comprising:
   a delay stage responsive to an analog control signal and responsive to one or more digital control signals, the delay stage configured to generate an output signal that is delayed relative to an input signal by a delay amount, wherein the delay amount corresponds to a value of the analog control signal and to one or more values of the one or more digital control signals,
   wherein the delay stage comprises a plurality of enablable inverters,
   wherein respective inputs of the plurality of enablable inverters are coupled to an input of the delay stage,
   wherein respective outputs of the plurality of enablable inverters are coupled to an output of the delay stage,
   wherein a first digital control signal of the one or more digital control signals controls whether a first enablable inverter of the plurality of enablable inverters is on or off, and
   wherein the analog control signal controls a drive strength of a second enablable inverter of the plurality of enablable inverters.

2. The circuit of claim 1, wherein a change in the delay amount corresponding to a change in the value of the analog control signal is smaller than the smallest change in the delay amount that can be produced by a change in the values of the one or more digital control signals.

3. The circuit of claim 1, wherein the programmable delay line comprises a plurality of the delay stages, and
   wherein a delay produced by the programmable delay line corresponds to a sum of the delays amounts of the delay stages.

4. The circuit of claim 1, wherein the delay amount corresponds to an inverse of a total drive current of the delay stage, and
   wherein the analog control signal and the one or more digital control signals control the total drive current of the delay stage.

5. The circuit of claim 1,
   wherein a maximum value of the portion of the total drive current provided by the second enablable inverter has a value substantially identical to a maximum value of the portion of the total drive current provided by the first enablable inverter.

6. The circuit of claim 5, wherein the delay stage further comprises:
   a third enablable inverter of the plurality of enablable inverters,
   wherein a maximum value of the portion of the total drive current provided by the third enablable inverter has a value substantially equal to a power of two multiplied by the maximum value of the portion of the total drive current provided by the first enablable inverter, the power of two being greater than one.

7. The circuit of claim 1, further comprising:
   a phase detector circuit to determine a phase difference between the input signal and the output clock;
   a comparator circuit to produce an output according to a value of an output signal of the phase detector circuit and a predetermined reference value;
   a control logic circuit to produce a Digital to Analog Converter (DAC) code signal and a plurality of multiplexer control signals according to an output of the comparator circuit;
   a DAC circuit to produce one or more DAC output signals according to the DAC code signal; and
   a multiplexer circuit to produce the analog control signal and the one or more digital control signals according to values of the plurality of multiplexer control signals and values of the one or more DAC output signals.

8. The circuit of claim 7, wherein the control logic circuit is further configured to:
   increase a value of the DAC code signal when the output of the comparator circuit has a first value; and
   decrease the value of the DAC code signal when the output of the comparator circuit has a second value, the second value being different from the first value.

9. The circuit of claim 8, wherein the control logic circuit is further configured to:
   increase a value of a multiplexer control signal of the plurality of multiplexer control signals and set the value of the DAC code signal to a predetermined minimum DAC value when the output of the comparator circuit has the first value and the value of the DAC code signal is equal to a predetermined maximum DAC value; and
   decrease the value of the multiplexer control signal of the plurality of multiplexer control signals and set the value of the DAC code signal to the predetermined maximum DAC value when the output of the comparator circuit has the second value and the value of the DAC code signal is equal to the predetermined minimum DAC value.

10. The circuit of claim 8,
    wherein the delay stage is a first delay stage,
    wherein the programmable delay line further comprises a second delay stage, and
    wherein the control logic circuit includes an indication of an active delay stage and is configured further to:
       when the indication of the active delay stage indicates the first delay stage, the output of the comparator circuit has the first value, and control signals corresponding to the first delay stage have a predetermined maximum stage value, update the indication of the active delay stage to indicate the second delay stage; and when the indication of the active delay stage indicates the second delay stage, the output of the comparator circuit has the second value, and the control signals corresponding to the second delay stage of the programmable delay line have a predetermined minimum stage value, update the indication of the active delay stage to indicate the first delay stage; and control the multiplexer circuit to provide the one or more DAC output signals to the delay stage indicated by the indication of the active delay stage.

11. A method for controlling a delay locked loop circuit, the method comprising:

providing, to a programmable delay line of the delay locked loop circuit, one or more digital signals, the programmable delay line including a first delay stage and a second delay stage;

when the first delay stage is an active stage and the first delay stage is providing a delay equal to a predetermined maximum delay value, selecting the second delay stage as the active stage to increase the delay produced by the programmable delay line;

when the second delay stage is the active stage and the second delay stage is providing a delay equal to a predetermined minimum delay value, selecting the first delay stage as the active stage to decrease the delay produced by the programmable delay line; and providing, to the active stage of the programmable delay line, an analog signal, wherein a first portion of a delay produced by the programmable delay line corresponds to values of the one or more digital signals, and a second portion of the delay produced by the programmable delay line corresponds to a value of the analog signal.

12. The method of claim 11, further comprising:
increasing the value of the analog signal to increase the delay produced by the programmable delay line; and
decreasing the value of the analog signal to decrease the delay produced by the programmable delay line.

13. The method of claim 11, further comprising:
increasing a value of a digital signal and setting the value of the analog signal to a minimum analog value to increase the delay produced by the programmable delay line; and
decreasing a value of a digital signal and setting the value of the analog signal to a maximum analog value to decrease the delay produced by the programmable delay line.

14. The method of claim 11, wherein the programmable delay line is an inverter-based delay line including a plurality of enablable inverters.

15. The method of claim 11, further comprising:
increasing the delay produced by the programmable delay line by decreasing total drive currents respectively produced by one or more of the plurality of enablable inverters; and
decreasing the delay produced by the programmable delay line programmable delay line by increasing total drive currents respectively produced by the one or more of the plurality of enablable inverters.

16. The method of claim 11, wherein providing the one or more digital signals comprises providing a thermometer coded signal having a plurality of bits.

17. The method of claim 11, wherein providing the one or more digital signals comprises providing a binary signal having a plurality of bits.

18. The method of claim 11, further comprising:
determining a phase difference between an input of the programmable delay line and an output of the programmable delay line;
comparing the phase difference to a predetermined threshold;
increasing the delay produced by the programmable delay line when the phase difference is greater than the predetermined threshold; and
decreasing the delay produced by the programmable delay line when the phase difference is less than the predetermined threshold.

\* \* \* \* \*